United States Patent
Jang

(10) Patent No.: US 10,121,406 B2
(45) Date of Patent: Nov. 6, 2018

(54) SHIFT REGISTER USING OXIDE TRANSISTOR AND DISPLAY DEVICE USING THE SAME

(71) Applicant: LG DISPLAY CO., LTD., Seoul (KR)

(72) Inventor: Yong-Ho Jang, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 201 days.

(21) Appl. No.: 15/220,102

(22) Filed: Jul. 26, 2016

(65) Prior Publication Data
US 2017/0032733 A1 Feb. 2, 2017

(30) Foreign Application Priority Data
Jul. 31, 2015 (KR) ........................ 10-2015-0108783

(51) Int. Cl.
| | | |
|---|---|---|
| G11C 19/00 | (2006.01) | |
| G09G 3/20 | (2006.01) | |
| H01L 29/786 | (2006.01) | |
| G11C 19/28 | (2006.01) | |

(52) U.S. Cl.
CPC ............ *G09G 3/2092* (2013.01); *G09G 3/20* (2013.01); *G11C 19/28* (2013.01); *H01L 29/78633* (2013.01); *G09G 2300/08* (2013.01); *G09G 2310/0267* (2013.01); *G09G 2310/0286* (2013.01); *G09G 2310/08* (2013.01); *G09G 2320/043* (2013.01); *G09G 2330/028* (2013.01)

(58) Field of Classification Search
None
See application file for complete search history.

(56) References Cited

U.S. PATENT DOCUMENTS

| | | | | |
|---|---|---|---|---|
| 2010/0289992 A1* | 11/2010 | Nojiri | ............... | G02F 1/133512 349/106 |
| 2012/0267513 A1* | 10/2012 | Jeon | .................... | H01L 27/1446 250/208.2 |
| 2015/0029082 A1 | 1/2015 | Jeon et al. | | |
| 2015/0070616 A1* | 3/2015 | Ogasawara | ........... | G02F 1/1339 349/43 |
| 2015/0187860 A1 | 7/2015 | Seo et al. | | |
| 2015/0187959 A1* | 7/2015 | Yoon | .................... | H01L 27/1225 257/43 |
| 2016/0282666 A1* | 9/2016 | Ro | ........................ | G02F 1/13454 |
| 2016/0322116 A1* | 11/2016 | Jang | ......................... | G09G 3/20 |
| 2017/0004760 A1* | 1/2017 | Jang | ..................... | G09G 3/2092 |

FOREIGN PATENT DOCUMENTS

| | | |
|---|---|---|
| CN | 103034000 A | 4/2013 |
| CN | 103296012 A | 9/2013 |
| JP | 2008224722 A | 9/2008 |

* cited by examiner

*Primary Examiner* — Tuan T Lam
(74) *Attorney, Agent, or Firm* — Dentons US LLP

(57) ABSTRACT

Disclosed is a shift register which is an embedded shift register using an oxide transistor is capable of improving output performance, operation range and output stability, and a display device using the same. In the shift register, each stage includes at least two light shielding layers individually overlapped with the transistors of the stage by dividing the transistors into at least two regions, and a connection transistor selectively applying a voltage to a first shielding layer overlapped with the pull-up transistor of the two light shielding layers to allow the first light shielding layer to float.

18 Claims, 19 Drawing Sheets

SHIFT REGISTER USING OXIDE TRANSISTOR AND DISPLAY DEVICE USING THE SAME

This application claims the benefit of Korean Patent Application No. 10-2015-0108783, filed on Jul. 31, 2015, which is hereby incorporated by reference as if fully set forth herein.

BACKGROUND

Field of the Invention

The present invention relates to a display device and a method for manufacturing the same, and more particularly, to a shift register of a display device, which uses an oxide transistor.

Discussion of the Related Art

Flat display devices include a liquid crystal display (LCD) device using liquid crystal, an organic light emitting diode (OLED) display device using an organic light emitting diode, an electrophoretic display (EPD) device using electrophoretic particles, and so on.

A flat display device includes a display panel for displaying an image through a pixel array including pixels, each of which is independently driven by a thin film transistor (TFT), a panel driver for driving the display panel, and a timing controller for controlling the panel driver. The panel driver includes a gate driver for driving gate lines of the display panel and a data driver for driving data lines of the display panel.

The gate driver includes a shift register which outputs scan pulses for individually driving the gate lines of the display panel. The shift register typically includes a plurality of stages dependently connected to one another. Each stage includes a plurality of TFTs. The output of each stage is supplied as the scan pulse to each gate line while being supplied as a carry signal for controlling another stage. Recently, the gate driver is integrally formed when the TFT array of the pixel array is formed by mainly using a gate in-panel (GIP) technique.

An oxide semiconductor TFT (hereinafter, referred to as an oxide TFT) is recently spotlighted as a TFT included in a display panel since the oxide TFT has higher mobility than that of an amorphous silicon TFT, and can be manufactured at a lower temperature than a poly-silicon TFT. Thus, such a display panel including an oxide semiconductor TFT is suitable for large-scale applications. However, the oxide TFT is sensitive to light and, as such, device characteristics may change when being exposed to light.

FIG. 1 is a voltage-current graph illustrating variable characteristics of a threshold voltage in accordance with time of light irradiation of a general N-type oxide TFT.

Referring to FIG. 1, as an active layer irradiated with light, an oxide active layer deteriorates and, as such, the threshold voltage Vth of the N-type oxide TFT shifts to a negative value. As light irradiation continues, the oxide active layer further deteriorates and, the threshold voltage Vth further shifts in the negative direction, as shown in FIG. 1.

In detail, although an off-voltage is applied as a gate voltage of the N-type oxide TFT mainly used as a shift register, the gate voltage is not lower than a low voltage applied to a source electrode. When an off-voltage is applied to the gate of the oxide TFT, the oxide TFT should be logically turned off. However, as the threshold voltage of the N-type oxide TFT shifts in the negative direction due to light deterioration, a leakage current, which flows because a voltage Vgs between the gate and source electrodes is greater than 0V (Vgs>0V), increases, and, as such, the shift register may not output a normal waveform.

For example, when the threshold voltage shifts in the negative direction due to light deterioration of the N-type oxide TFT, a leakage current of a node control part for controlling a pull-up TFT is generated and, as such, the voltage of a control node is distorted. Accordingly, output faults, such as a distorted waveform of the scan pulse output by the pull-up TFT or an uneven output of the scan pulse, may be generated.

SUMMARY

Accordingly, the present invention is directed to a display device and a shift register thereof that substantially obviate one or more problems due to limitations and disadvantages of the related art.

An advantage of the present invention is to provide a display device having a shift register with improved output performance and/or output stability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages. Each stage includes an output part, a node control part, at least two light shielding layers, and a connection transistor. The output part may include a pull-up transistor responding to a logic state of a first node to output a corresponding clock of a plurality of clocks as a scan signal, and a pull-down transistor responding to a logic state of a second node to output a low voltage as the scan signal. The node control part may include a plurality of transistors for controlling the logic state of the first node and the logic state of the second node. The at least two light shielding layers may be individually overlapped with the transistors of the stage by dividing the transistors into at least two regions. The connection transistor selectively applies a voltage to a first shielding layer overlapped with the pull-up transistor of the two light shielding layers to allow the first light shielding layer to float.

The connection transistor may include a gate applying a control signal, a first electrode applying the voltage, and a second electrode electrically connected to the first light shielding layer. As the control signal, the voltage of the first node may be applied. One of the scan signal, the corresponding clock, a carry signal, and an external AC voltage is applied to the first electrode. As the control signal, a pulse signal may be applied periodically or non-periodically as a frame unit, and one of low voltages including the first low voltage applied to the stage is applied to the first electrode. When the carry signal is applied to the first electrode, the stage may further include a second pull-up transistor outputting a carry clock identical to or different from the corresponding clock as the carry signal by response of the logic state of the first node, and a second output part outputting a second low voltage of the low voltages as the carry signal by response of the logic state of the second node.

The light shielding layers may include the first light shielding layer and a second light shielding layer applying one of low voltages. The light shielding layers may include the first light shielding layer, the second light shielding layer, and a third light shielding layer applying one of the scan signal and carry signal.

The node control part may include a set part, a reset part, a noise cleaner, and an inverter. The set part sets the first node as a voltage for the set part by response of the logic state of a first control terminal. The reset part resets the first node to one of the first and second low voltages by response of the logic state of a second control terminal. The noise cleaner resets the first node to the second low voltage by response of the logic state of the second node, The inverter outputs a high voltage or low voltage for the inverter having a logic state contrary to that of the first node to the second node by response of the logic state of the first node. A start pulse, or a previous scan signal or previous carry signal output from one of previous stages may be supplied to the first control terminal. A high voltage, or the previous scan signal or the previous carry signal may be supplied to the voltage for the set part. A reset pulse, or a next scan signal or next carry signal output from one of next stages may be supplied to the second control terminal.

The noise cleaner may include a first and second transistors connected between the first node and a supply line of the second low voltage connected to each other in series to reset the first node to the second low voltage in accordance with the logic state of the second node, and a third transistor supplying an offset voltage of a high level to a connection node between the first and second transistors in accordance with the logic state of the first node.

When the light shielding layers include the first and second light shielding layers, the first light shielding layer may be overlapped with the pull-up transistor, the second pull-up transistor, the set part and transistor connected to the high voltage for the inverter, and may be overlapped or non-overlapped with the connection transistor, and the second light shielding layer may be overlapped with the transistors except for the transistor overlapped with the first light shielding layer in each stage. The first light shielding layer may be overlapped with the pull-up transistor and the second pull-up transistor, and may be overlapped or non-overlapped with the connection transistor, and the second light shielding layer may be overlapped with the transistors except for the transistor overlapped with the first light shielding layer in each stage. The first light shielding layer may be overlapped with the pull-up transistor, and may be overlapped or non-overlapped with the connection transistor, and the second light shielding layer may be overlapped with the transistors except for the pull-up transistor.

When the light shielding layers include the first to third light shielding layers, the first light shielding layer may be overlapped with the pull-up transistor, the second light shielding layer may be overlapped with the reset part, the pull-down transistor, the second pull-down transistor, and the first and second transistor of the noise cleaner, the third light shielding layer may be overlapped with the set part. The second pull-up transistor may be overlapped with one of the first to third light shielding layers. The transistors connected to the high voltage for the inverter in the inverter may be overlapped with one of the second and third light shielding layers The transistor connected to the low voltage for the inverter in the inverter may be overlapped with one of the second and third light shielding layers. The third transistor of the noise cleaner may be overlapped with one of the second and third light shielding layers. The connection transistor may be overlapped with one of the first to third light shielding layers.

The light shielding layer may include the first to third light shielding layers, and a fourth light shielding layer overlapped with the set part and to which one of the scan signal, the carry signal and previous scan signal, the previous carry signal, and the low voltages may be applied. The first light shielding layer may be overlapped with the pull-up transistor, the second light shielding layer may be overlapped with the reset part, the pull-down transistor, the second pull-down transistor, and the first and second transistors of the noise cleaner. The second pull-up transistor may be overlapped with one of the first to third light shielding layers. The transistors connected to the high voltage for the inverter may be overlapped with one of the second and third light shielding layers. The transistor connected to the low voltage for the inverter may be overlapped with one of the second and third light shielding layers. The third transistor of the noise cleaner may be overlapped with one of the second and third light shielding layers. The connection transistor may be overlapped with one of the first to fourth light shielding layers. The fourth light shielding layer to which the scan signal or carry signal is applied, may be electrically connected to the third light shielding layer through direct connection or indirect connection. The fourth light shielding layer to which one of the low voltages is applied, may be electrically connected to the second light shielding layer through direct connection or indirect connection.

The set part may include a first and second set transistors connected between the first node and the supply line of the voltage for the set part in series, and is controlled by the first control terminal. The reset part may include a first and second reset transistor connected between the first node and one of supply lines for the first low voltage and second low voltage in series, and is controlled by the second control terminal. A connection node between the first and second set transistors and a connection node between the first and second reset transistors may be electrically connected to a connection node between the first and second transistors of the noise cleaner.

In accordance with another aspect of the present invention, there is provided a display device including a gate driver embedded in a non-display area of a display panel. The gate driver includes the shift register, as described above, individually driving gate lines of the display panel, wherein the shift register may include an oxide transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Hereinafter, embodiments of the present invention will be described in detail with reference to the accompanying drawings.

Figure 1:
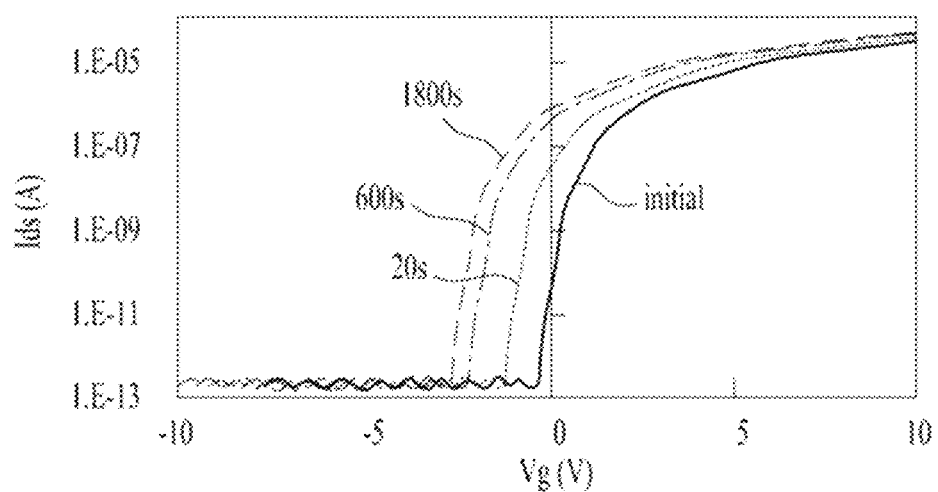
FIG. 1 is a graph showing variable characteristics of a threshold voltage in accordance with time of light irradiation to a general oxide TFT.
Figure 2:
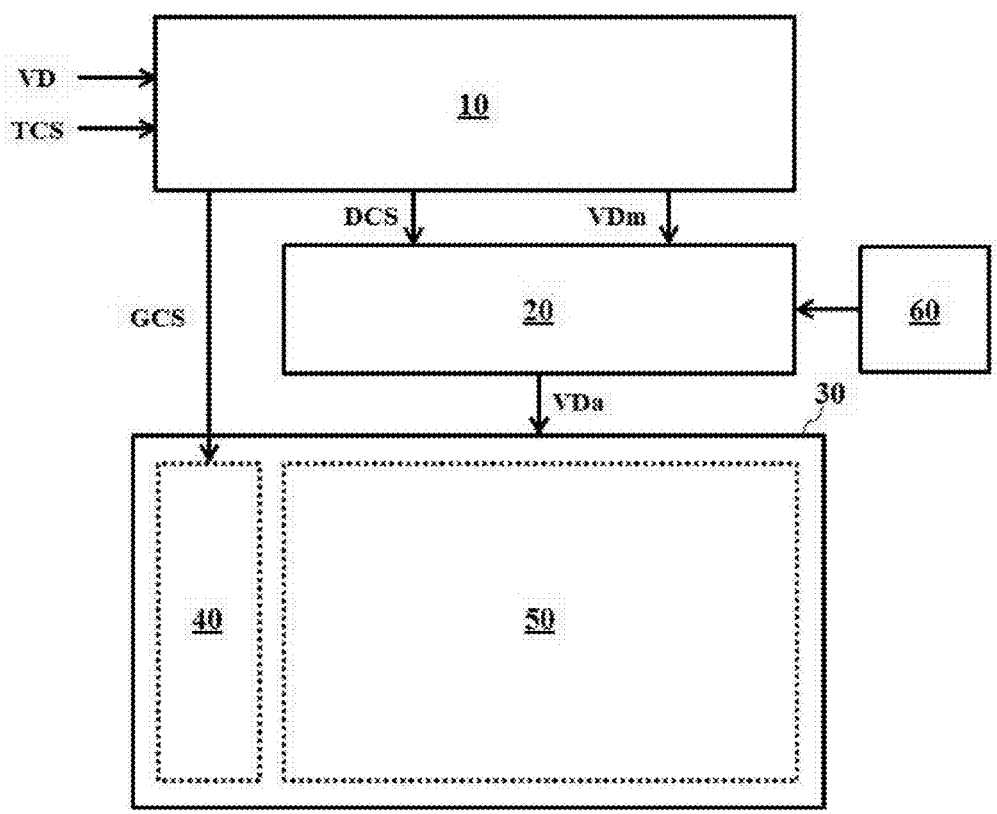
FIG. 2 is a block diagram schematically illustrating a configuration of a display device according to an embodiment of the present invention.
Figure 3:
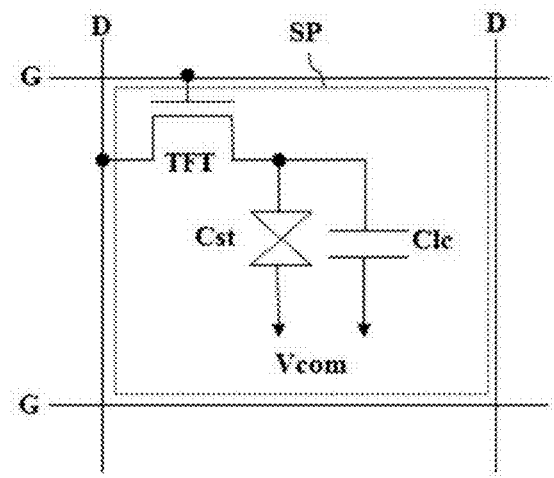
FIG. 3 is an equivalent circuit diagram illustrating a structure of an LCD sub-pixel applied to the display panel illustrated in FIG. 2.
Figure 4:
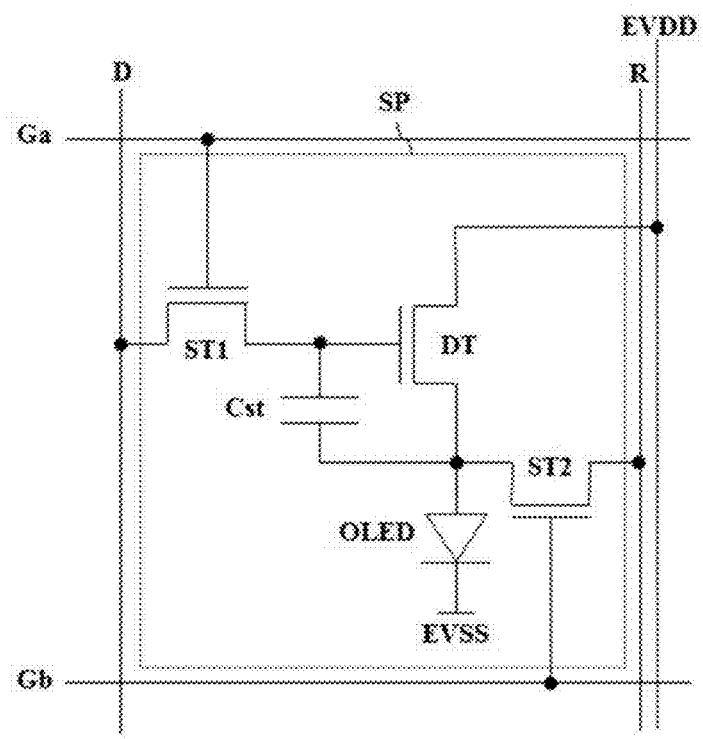
FIG. 4 is an equivalent circuit diagram illustrating a structure of an OLED sub-pixel applied to the display panel illustrated in FIG. 2.

FIG. 2 is a block diagram illustrating a configuration of a display device with a shift register embedded therein according to an embodiment of the present invention. FIGS. 3 and 4 are equivalent circuit diagrams illustrating structures of an LCD sub-pixel and an OLED sub-pixel applied to the display device illustrated in FIG. 2, respectively.

The display device illustrated in FIG. 2 includes a display panel 30 including a pixel array 50 and a gate driver 40, a data driver 20, a timing controller 10, a gamma voltage generator 60, and a power supply (not shown).

The timing controller 10 receives image data VD supplied from a host set and a timing control signal TCS. The timing controller 10 modulates the image data VD using various data processing methods, and outputs the modulated image data VDm to the data driver 20.

The timing controller 10 generates a data control signal DCS for controlling operation timing of the data driver 20 using the timing control signal TCS, and a gate control signal GCS for controlling operation timing of the gate driver 40. The timing controller 10 supplies the data control signal DCS and the gate control signal GCS to corresponding drivers, respectively. The timing control signal TCS includes a dot clock and a data enable signal. The timing control signal TCS may further include a horizontal synchronization signal and a vertical synchronization signal. The data control signal DCS includes a source start pulse and source shift clock for controlling latch timing of the modulated image data VDm in the data driver 20, a source output enable signal for controlling an output period of an image data signal VDa, and so on. The gate control signal includes a start pulse for the gate, which controls an operation point of the gate driver 40, clocks for the gate, which is used as an output signal or a shift control signal, and so on.

A level shifter (not shown) may be further provided between the timing controller 10 and gate driver 40. The level shifter may be embedded in the power supply. The level shifter level-shifts the gate control signal GCS from the timing controller 10, that is, a transistor-transistor level (TTL) voltage of the start pulse and clocks for the gate, to a gate-on voltage (a gate high voltage) and a gate-off voltage (a gate low voltage) for driving the TFTs of the pixel array 50, and then supplies the gate-on and gate-off voltages to the gate driver 40.

The data control signal DCS and the modulated image data VDm from the timing controller 10 are supplied to the data driver 20. The data driver 20 is driven in accordance with the data control signal DCS. After a set of reference gamma voltages supplied from the gamma voltage generator 60 is subdivided into grayscale voltages corresponding to grayscale values of the data, respectively, the digital image data VDm are respectively converted into analog image data signals VDa using the subdivided grayscale voltages. The analog image data signals VDa are supplied to the data lines of the display panel 30, respectively.

The data driver 20 includes a plurality of data drive ICs divisionally driving the data lines of the display panel 30. After being mounted on a circuit film, such as, a tape carrier package (TCP), a chip on film (COF), a flexible printed circuit (FPC), and so on, each data drive IC may be attached to the display panel 30 through a tape-automated bonding (TAB) or may be mounted on the display panel 30 in a chip on glass manner.

The display panel 30 displays an image through the pixel array 50 where the pixels are arranged in a matrix. Each pixel of the pixel array 50 typically realizes a desired color using a combination of a red sub-pixel, a green sub-pixel, and a blue sub-pixel. A white sub-pixel may further be provided to improve brightness. Each sub-pixel is independently driven by the TFT. An amorphous silicon (a-Si) TFT, a poly silicon (poly-Si) TFT, an oxide TFT, or an organic TFT may be used as the TFT, but the oxide TFT is used in the illustrated embodiment. An LCD panel, an OLED display panel or an EPD panel may be used as the display panel 30.

For example, when the display panel 30 is an LCD panel, as illustrated in FIG. 3, each sub-pixel SP includes a TFT connected to one gate line G and one data line D, and a liquid crystal capacitor Clc and a storage capacitor Cst arranged in parallel between the TFT and a common electrode. The liquid crystal capacitor Clc charges a difference voltage between the data signal supplied to a pixel electrode through the TFT and a common voltage Vcom supplied to a common electrode. The liquid crystal capacitor Clc drives the liquid crystal in accordance with a charged voltage, and an amount of light transmission is controlled by the charged voltage. The storage capacitor Cst serves to stably maintain the charged voltage of the liquid crystal capacitor Clc.

On the other hand, when the display panel 30 is an OLED panel, as illustrated in FIG. 4, each sub-pixel includes an OLED device connected between a high voltage line EVDD and a low voltage line EVSS, first and second switching TFTs ST1 and ST2 for independently driving each OLED, and a pixel circuit including a driving TFT DT and a storage capacitor Cst.

Each OLED device includes an anode connected to the drive TFT DT, a cathode connected to the low voltage EVSS line, and an emitting layer disposed between the anode and cathode. Each OLED generates light proportional to an amount of current supplied from the drive TFT DT.

The first switching TFT ST1 is driven by a gate signal of one gate line Ga to supply a data voltage from the corresponding data line D to a gate node of the drive TFT DT. The second switching TFT ST2 is driven by a gate signal of another gate line Gb to supply a reference voltage from a reference line R to a source node. In a sensing mode, the second switching TFT ST2 is also used as an output path of current from the drive TFT DT to the reference line R.

The storage capacitor Cst connected between the gate node and source node of the drive TFT DT charges a difference voltage between the data voltage supplied to the gate node through the first switching TFT ST1 and the reference voltage supplied from the source node through the second switching TFT ST2, and then, is supplied as a drive voltage of the drive TFT DT.

The drive TFT DT supplies an amount of current supplied from a high voltage EVDD line that is proportional to the drive voltage supplied from the storage capacitor Cst to the OLED device to emit light.

The gate driver 40 is embedded in a non-display area of the display panel 30 to have a GIP type. The gate driver 40 includes a plurality of oxide TFTs formed on the substrate when the TFT array of the pixel array 50 is formed on the substrate. The gate driver 40 includes a shift register which responds to the gate control signal GCS from the timing controller 10 to individually drive the gate lines G of the pixel array 50 sequentially or in an interlaced manner. The gate control signal GCS from the timing controller 10 may be supplied to the gate driver 40. On the other hand, the gate control signal GCS from the timing controller 10 through the data driver 20 may be supplied to the gate driver 40. During an operation period of each gate line G, the gate driver 40 supplies the scan pulse of the gate-on voltage to the corresponding gate line G to be in an enable state. During a remaining period except the operation period, the gate driver 40 supplies the gate-off voltage to the corresponding gate line G to be in a disable state. The embedded gate driver 40 may be formed at one side of a peripheral area or at both sides of the peripheral area.

The shift register of the gate driver 40 includes a light shielding layer, which is overlapped with an oxide active layer to absorb external and internal light, and, as such, the deterioration of the oxide TFT due to an exposure to light may be reduced or prevented. Particularly, each stage of the shift register further includes a connection TFT that applies a voltage to the light shielding layer overlapped with an output TFT during a particular period of time, so that the light shielding layer is selectively in an electrically floating state. As a result, a clock load due to the light shielding layer can be reduced, and output characteristics can be improved by restricting voltage dissipation. Furthermore, the light shielding layer of each stage may be divided into a plurality of regions to which different voltages are applied so that the characteristics of the TFTs can be controlled depending on their desired functions on a region-by-region basis.

Figure 5:
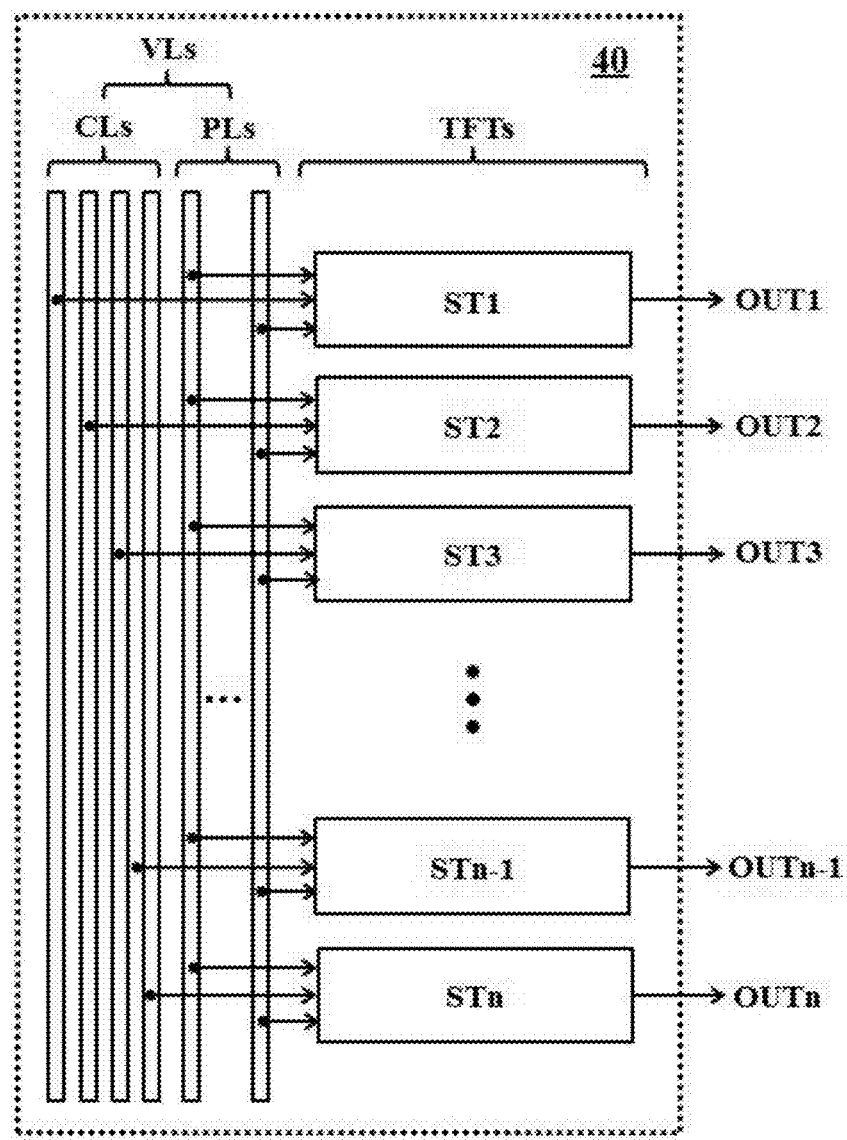
FIG. 5 is a block diagram schematically illustrating a shift register used as a gate driver illustrated in FIG. 2.
Figure 6:
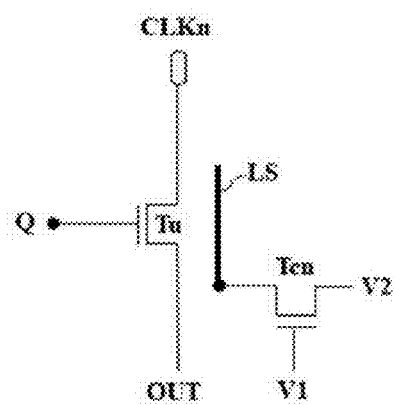
FIG. 6 is a circuit diagram illustrating a basic configuration of an output part in each stage illustrated in FIG. 5.
Figure 7A:
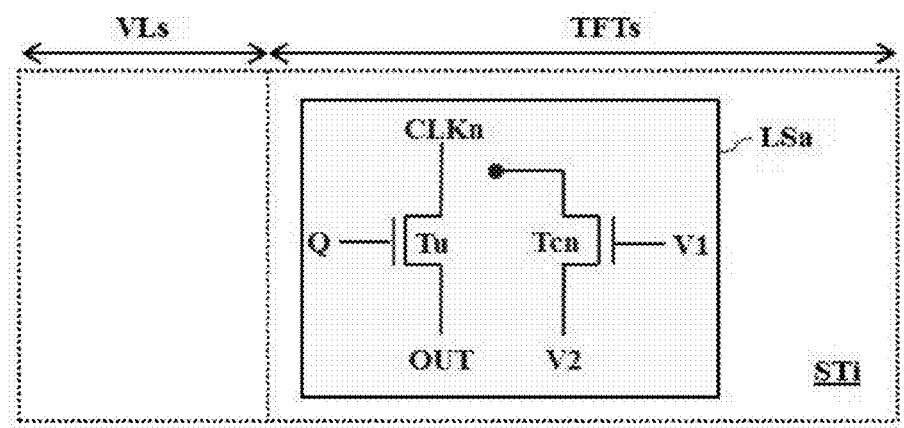
FIGS. 7A to 7C are views schematically illustrating examples of a light shielding layer illustrated in FIG. 5.
Figure 7B:
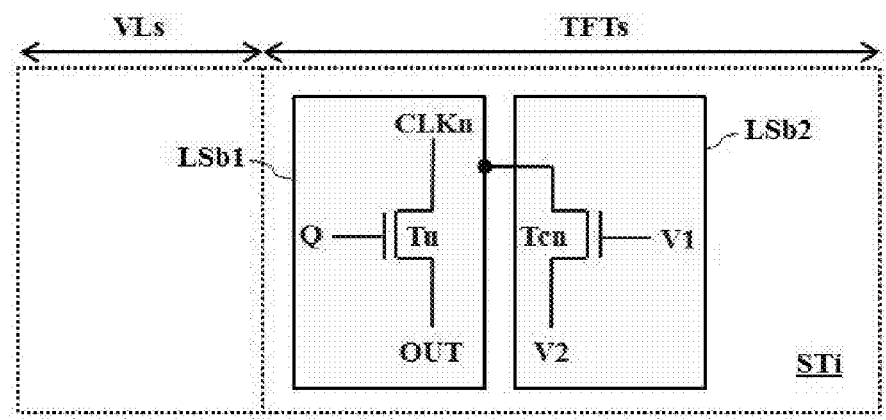
Figure 7C:
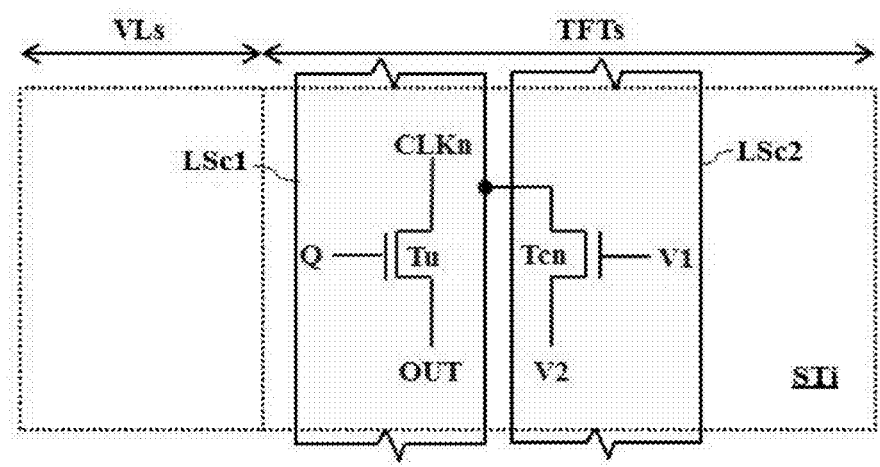

FIG. 5 is a block diagram schematically illustrating a shift register used in a gate driver illustrated in FIG. 2. FIG. 6 is a circuit diagram illustrating a basic configuration of an output part in each stage illustrated in FIG. 5. FIGS. 7A to 7C are views schematically illustrating examples of a light shielding layer illustrated in FIG. 5.

The shift register illustrated in FIG. 5 includes a TFT part TFTs including a plurality of stages ST1 to STn for individually supplying scan outputs OUT1 to OUTn to a plurality of gate lines, and a wiring part VLs. The wiring part VLs includes a plurality of clock lines CLs for supplying a plurality of clock signals, and a plurality of power lines PLs for supplying a plurality of power voltages.

Hereinafter, a "previous stage" indicates at least one of the stages driven prior to a corresponding stage to output a scan pulse, and a "next stage" indicates at least one of the stages driven after the corresponding stage to output a scan pulse.

A plurality of clock signals each having different phases are supplied to the shift register through the clock lines CLs. As the clock signals circulate, at least one of the clock signals is supplied to every stage.

Each of the stages ST1 to STn is sequentially driven to supply the corresponding clock as a scan output OUT to the corresponding gate line and as a carry signal for controlling at least one of the previous or next stages. A start pulse instead of the carry signal from the previous stage is supplied to the first stage ST1. A reset pulse instead of the carry signal from the next stage may be supplied to the last stage STn.

Each of the stages ST1 to STn constituting the TFT part TFTs includes a plurality of oxide TFTs and at least one light shielding layer LS overlapped with an oxide active layer disposed below the TFT part TFTs in order to reduce or prevent deterioration of the oxide active layer due to an exposure to light.

Referring to FIG. 6, each stage ST further includes a connection TFT Tcn for applying a voltage to the light shielding layer LS overlapped with a pull-up TFT Tu of the output part during a particular period in order to allow the light shielding LS to selectively float. The connection TFT Tcn responds to a control signal V1 and applies a voltage V2 to the light shielding layer LS during the particular period.

For example, the connection TFT Tcn responds to the control signal V1, and then the pull-up TFT Tu is turned on during a turning-on period, and, as such, the voltage V2 is applied to the light shielding layer LS. During the period except the turning-on period, the pull-up TFT Tu allows the light shield layer LS to float. The control signal V1 of the connection TFT Tcn may be a control node (hereinafter, referred to as Q node) voltage for controlling the pull-up TFT Tu or other control signals, such as, the start pulse or reset pulse applied to every frame. One of the output voltage OUT of the pull-up TFT Tu, the output clock CLKn applied to the pull-up TFT Tu, the carry output, or an external AC voltage having two or more phases, is used as the voltage V2 applied through the connection TFT Tcn to the light shielding layer LS.

Accordingly, the clock load due to selective floating of the light shielding layer LS of the pull-up TFT Tu may be reduced. Furthermore, the voltage of the light shielding layer LS is periodically reset and, as such, voltage dissipation or fluctuation may be reduced or prevented. As a result, output characteristics may be improved.

Referring to FIGS. 7A, 7B, and 7C, each stage STi includes at least one light shielding layer LSa, LSb1, LSb2, LSc1, and LSc2 overlapped with at least part of the pull-up TFT Tu and the connection TFT Tcn in the TFT part TFTs. Each light shielding layer LSa, LSb1, LSb2, LSc1, and LSc2 is disposed above or below the TFT Tu or Tcn, which is separate from a layer including the TFT Tu or Tcn.

As illustrated in FIG. 7A, the pull-up TFT Tu and connection TFT Tcn of each stage STi may share the light shielding layer LSa. As illustrated in FIG. 7B, a light shielding layer LSb1 overlapped with the pull-up TFT Tu and a light shielding layer LSb2 overlapped with the connection TFT Tcn may be separated. As illustrated in FIG. 7C, a light shielding layer LSc1 overlapped with the pull-up TFT Tu and a light shielding layer LSc2 overlapped with the connection TFT Tcn are separated, but the light shielding layer LSc1 may share another stage and the light shielding layer LSc2 may share another stage.

Figure 8:
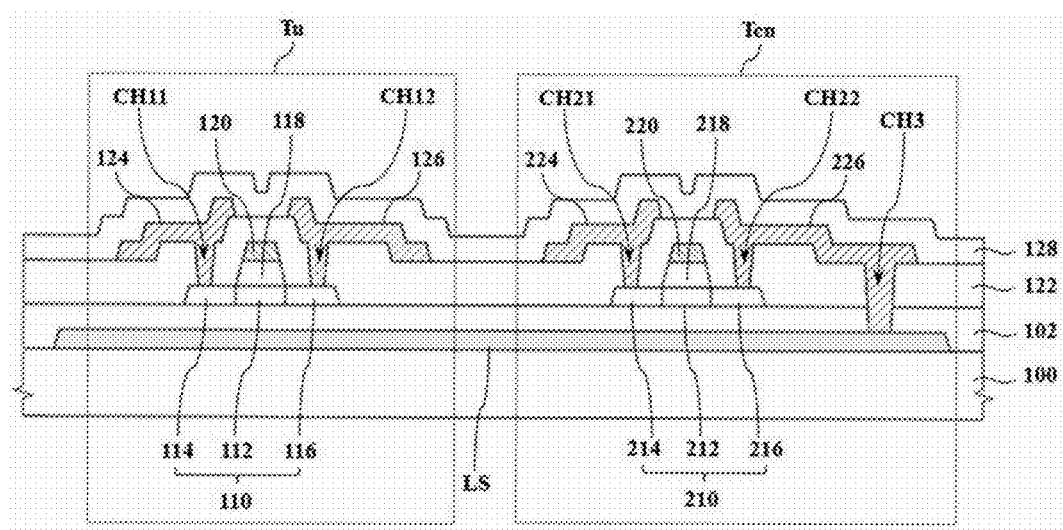
FIG. 8 is a sectional view illustrating a TFT structure of the output part illustrated in FIG. 7A.

FIG. 8 is a sectional view illustrating structures of a pull-up TFT and a connection TFT Tcn illustrated in FIG. 7A.

Referring to FIG. 8, the pull-up TFT Tu and the connection TFT Tcn share a light shielding layer LS on the substrate 100, a buffer layer 102 covering the light shielding layer LS on the substrate 100, an interlayer dielectric 122 on the buffer layer 102, and a passivation layer 128 on the interlayer dielectric 122.

The pull-up TFT Tu includes an active layer 110 on the buffer layer 102, a gate dielectric 118 and a gate electrode 120 stacked on the active layer 110, and a source electrode 124 and a drain electrode 126 respectively connected to a source region 114 and a drain region 116 of the active layer 110 through contact holes CH11 and CH12 passing through the interlayer dielectric 122 covering the gate dielectric 118 and the gate electrode 120. The active layer 110 includes a channel region 112 overlapped with the gate electrode 120 where the gate dielectric 118 is interposed between the channel region 112 and gate electrode 120, and the conductive source region 114 and drain region 116 for ohmically contacting the source electrode 124 and drain electrode 126.

The connection TFT Tcn includes an active layer 210 on the buffer layer 102, a gate dielectric 218 and a gate electrode 220 on the active layer 210, a source electrode 224 and a drain electrode 226 respectively connected to a source region 214 and a drain region 216 of the active layer 210 through contact holes CH21 and CH22 passing through the interlayer dielectric 122 covering the gate dielectric 218 and gate electrode 220. Particularly, the drain electrode 226 is connected to the light shielding layer LS through a contact hole CH3 passing through the interlayer dielectric 122 and the buffer layer 102. The active layer 210 includes a channel region 212 and the conductive source region 214 and drain region 216 for ohmically contacting the source electrode 224 and drain electrode 226.

The light shielding layer SL is formed of an opaque metal or a semiconductor. The light shielding layer SL absorbs external and internal light and, as such, may reduce or prevent an introduction of light to the active layer 110 and 210 formed of an oxide semiconductor. The light shielding layer LS shared by the pull-up TFT Tu and the connection TFT Tcn selectively floats in accordance with a control of the connection TFT Tcn.

Hereinafter, a method of manufacturing an oxide TFT including TFT Tu and Tcn illustrated in FIG. 8 will be described.

The light shielding layer LS is formed on the substrate 100 using a first mask process. After a light shielding material is coated on a top surface of the substrate 100, the light shielding material is patterned by a patterning process including a photolithography process and an etching process using a first mask, and, as such, the light shielding layer LS is formed in one region of the substrate 100. The light shielding layer LS is formed of metal or semiconductor as an opaque thin film.

The buffer layer 102 and the active layers 110 and 210 on the buffer layer 102 are formed by a second mask process. The buffer layer 102 is coated on the substrate 100 where the light shielding layer LS is formed. The buffer layer 102 is formed of dielectric material such as silicon oxide ($SiO_2$), silicon nitride ($SiN_x$), and so on. After the oxide semiconductor layer is coated on a top surface of the buffer layer 102, the oxide semiconductor layer is patterned by a patterning process using a second mask, and, as such, the active layers 110 and 210 are formed to be overlapped with a part of the light shielding layer LS. The active layers 110 and 210 are formed of an amorphous zinc oxide semiconductor and an amorphous indium gallium zinc oxide (a-IGZO) semiconductor. For example, an a-IGZO semiconductor may be formed by a sputtering method or a chemical depositing method. The sputtering method may use a compound target including gallium oxide ($Ga_2O_3$), indium oxide ($In_2O_3$) and zinc oxide (ZnO).

The gate dielectric layers 118 and 218 and the gate electrodes 120 and 220 are formed on the active layers 110 and 210 to each have a stack structure using a third mask process. After the gate dielectric material and the gate metallic material are sequentially coated on the active layers 110 and 210, the coated gate dielectric material and gate metallic material are patterned by a patterning process using a third mask, and, as such, the gate electrodes 120 and 220 and the gate dielectric layers 118 and 218 aligned with the gate electrodes 120 and 220, respectively, are formed. Subsequently, parts of active layers 110 and 210 each exposed by the gate electrodes 120 and 220 are treated by plasma or ultraviolet (UV) light and, as such, the conductive source regions 114 and 214 and the drain regions 116 and 216 are formed by penetration and diffusion of metallic material. Regions overlapped with the gate electrodes 120 and 220 are used as the channel regions 112 and 212 having oxide semiconductor material. Silicon oxide ($SiO_2$) and silicon nitride ($SiN_x$) are selectively used as the gate dielectric layers 118 and 218. The gate electrodes 120 and 220 may have a multiple structure including at least one element selected from the group including copper (Cu), molybdenum (Mo), aluminum (Al), chromium (Cr), gold (Au), titanium (Ti), nickel (Ni), neodymium (Nd), tantalum (Ta), and tungsten (W), or alloy an thereof.

The interlayer dielectric layer 122 and the contact holes CH11, CH12, CH21, CH22, and CH3 are formed using a fourth mask process. After the interlayer dielectric layer 122 is coated on the buffer layer 102 to cover the gate electrodes 120 and 220, gate dielectric layers 118 and 218, and active layers 110 and 210, the contact holes CH11 and CH21 each exposed to the source regions 114 and 214 and the contact holes CH12 and CH22 each exposed to the drain regions 116 and 216 are formed by a patterning process using a fourth mask. In this case, the contact hole CH3 passing through the interlayer dielectric layer 122 and the buffer layer 102 to expose a part of the light shielding layer LS is also formed. The interlayer dielectric layer 122 is formed of silicon oxide (SiO$_2$), silicon nitride (SiNx) or a stack structure thereof.

The source electrodes 124 and 224 and the drain electrodes 126 and 226 are formed on the interlayer dielectric layer 122 using a fifth mask process. After the source/drain metallic layer is coated on an entire interlayer dielectric layer 122, the source/drain metallic layer is patterned by a patterning process using a fifth mask, and, as such, the source electrodes 124 and 224 and the drain electrodes 126 and 226 are formed. The source electrodes 124 and 224 are connected to the source regions 114 and 214 of the active layers 110 and 210 through the contact holes CH11 and CH21, respectively. The drain electrodes 126 and 226 are connected to the drain regions 116 and 216 of the active layers 110 and 210 through the contact holes CH12 and CH22, respectively. The drain electrode 226 of the connection TFT Tcn is connected to the light shielding layer LS through the contact hole CH3. The source/drain metallic layer is formed by using at least one element selected from the group including copper (Cu), molybdenum (Mo), aluminum (Al), chromium (Cr), gold (Au), titanium (Ti), nickel (Ni), neodymium (Nd), or an alloy thereof.

In succession, the passivation layer 128 is formed on the interlayer dielectric 122 to cover the source electrodes 124 and 224 and the drain electrodes 126 and 226, and then subsequent mask processes are performed.

FIGS. 9 to 12 are circuit diagrams each illustrating a basic configuration of each stage in shift registers according to first to fourth embodiments of the present invention.

Figure 9:
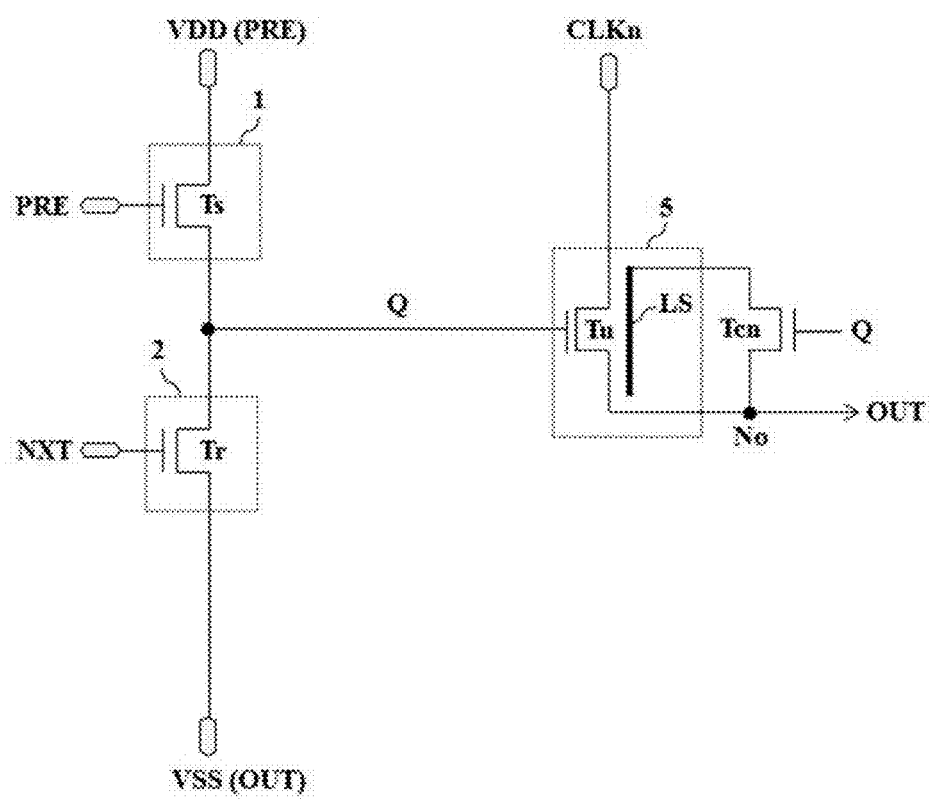
FIG. 9 is a circuit diagram illustrating a basic configuration of each stage in a shift register according to a first embodiment of the present invention.
Figure 10:
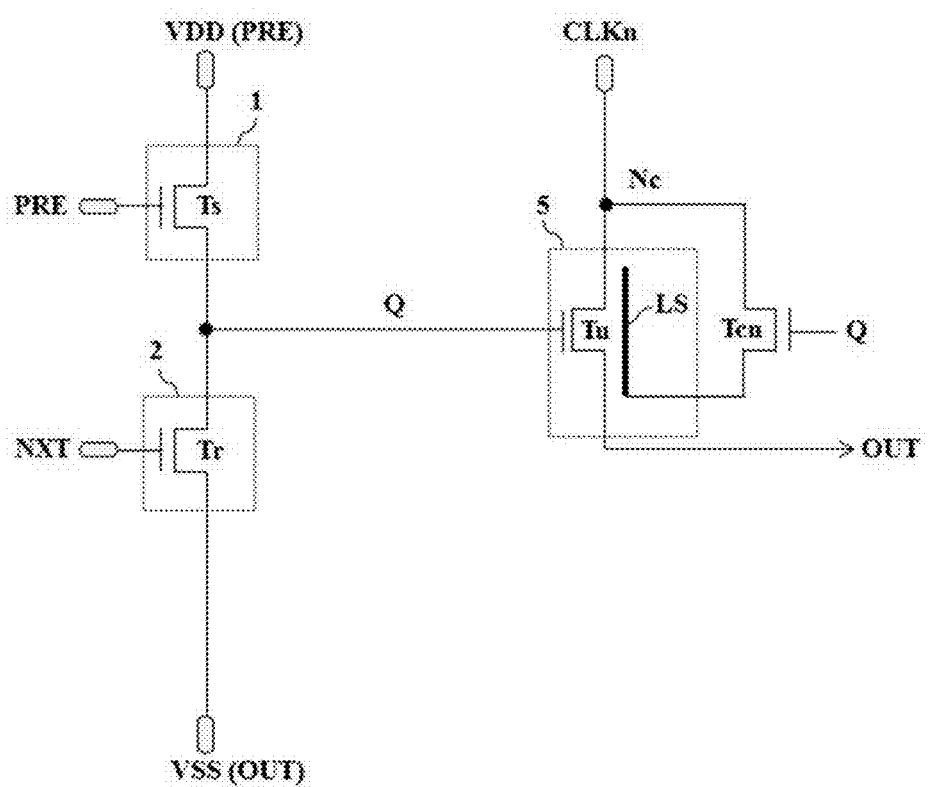
FIG. 10 is a circuit diagram illustrating a basic configuration of each stage in a shift register according to a second embodiment of the present invention.
Figure 11:
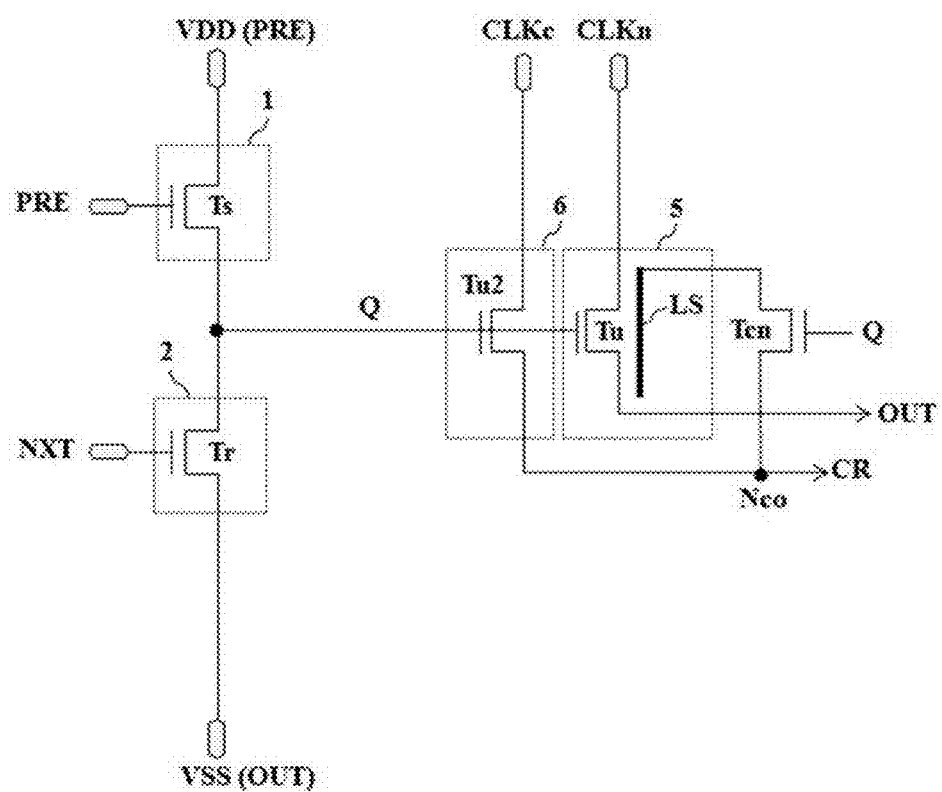
FIG. 11 is a circuit diagram illustrating a basic configuration of each stage in a shift register according to a third embodiment of the present invention.

Referring to FIGS. 9 to 12, each stage of the shift register basically includes a set TFT Ts of a set part 1, a reset TFT Tr of a reset part 2, a pull-up TFT Tu of an output part 5, and a connection TFT Tcn. As illustrated in FIG. 11, a second pull-up TFT Tu2 of a second output part 6 may be further provided.

The set TFT Ts of the set part 1 responds to a previous output PRE or a start pulse to supply a high voltage VDD or the previous output PRE to a Q node and, as such, sets the Q node to a high level.

The reset TFT Tr of the reset part 2 responds to a next output NXT or a reset pulse to supply a low voltage VSS or a corresponding output OUT to the Q node and, as such, sets the Q-node to a low level.

The pull-up TFT Tu of the output part 5 responds to a high level state of the Q node, and, as such, a corresponding clock CLKn is output as a scan output OUT.

The second pull-up TFT Tu2 of the second output part 6 as illustrated in FIG. 11 responds to the high level state of the Q node and, as such, a carry clock CLKc is output as a carry output CR. The carry clock CLKc may be identical to or different from a clock CLKn used as the output OUT of the pull-up TFT Tu.

The connection TFT Tcn applies a voltage to the light shielding layer LS of the pull-up TFT Tu during a particular period and, as such, the light shielding layer LS is in a selectively floating state.

The connection TFT Tcn applies a voltage of the high level to the light shielding layer LS during a clock output period for outputting the scan output OUT of the high level. On the other hand, the voltage is not applied to the light shielding layer LS during the period except for the clock output period, and, as such, the light shielding layer LS may become in a floating state.

Referring to FIG. 9, in the connection TFT Tcn according to the first embodiment, a gate may be connected to the Q node, a source may be connected to an output node No, and a drain may be connected to the light shielding layer LS of the pull-up TFT Tu. Accordingly, the connection TFT Tcn responds to a logic state of the Q node to be turned on in company with the pull-up TFT Tu, and, as such, the output OUT of the pull-up TFT Tu may be applied to the light shielding layer LS of the pull-up TFT Tu.

Referring to FIG. 10, in the connection TFT Tcn according to the second embodiment, a gate may be connected to the Q node, a source may be connected to a clock node Nc, and a drain is connected to the light shielding layer LS of the pull-up TFT Tu. Accordingly, the connection TFT Tcn responds to the logic state of the Q node to be turned on in company with the pull-up TFT Tu, and, as such, the corresponding clock CLKn may be applied to the light shielding layer LS of the pull-up TFT Tu.

Referring to FIG. 11, in the connection TFT Tcn according to the third embodiment, a gate may be connected to the Q node, a source may be connected to a carry output node Nco, and a drain may be connected to the light shielding layer LS of the pull-up TFT Tu. Accordingly, the connection TFT Tcn responds to the logic state of the Q node to be turned on in company with the pull-up TFT Tu, and, as such, a carry output CR may be applied to the light shielding layer LS of the pull-up TFT Tu.

Figure 12:
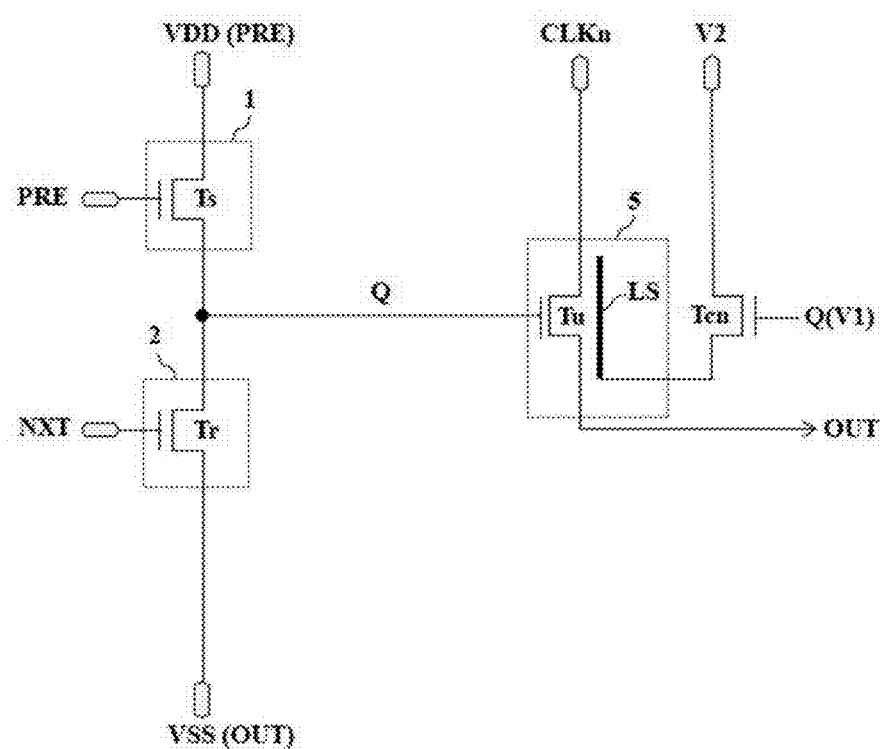
FIG. 12 is a circuit diagram illustrating a basic configuration of each stage in a shift register according to a fourth embodiment of the present invention.

Referring to FIG. 12, in a connection TFT Tcn according to the fourth embodiment, a gate may be connected to a Q node or a supply terminal for a control signal V1, a source may be connected to a supply terminal for a control signal V2, and a drain may be connected to a light shielding layer LS of a pull-up TFT Tu.

Accordingly, the connection TFT Tcn responds to a logic state of the Q node to be turned on in company with the pull-up TFT Tu, and, as such, the voltage V2 may be applied to the light shielding layer LS of the pull-up TFT Tu. An AC voltage having two or more phases, or a DC voltage may be used as the voltage V2. The AC voltage having two or more phases may be alternately applied to every stage.

As illustrated above, during a scan period of the corresponding gate line for a stable scan output OUT of the pull-up TFT Tu, the connection TFT Tcn applies a voltage having a similar level to the source electrode to the light shielding layer LS of the pull-up TFT Tu and, as such, the pull-up TFT Tu has a dual gate structure. As a result, output characteristics of the pull-up TFT Tu may be improved. Furthermore, during the period including scan periods of other gate lines and except for the scan period of the corresponding gate line, the connection TFT Tcn allows the light shielding layer LS of the pull-up TFT Tu to float and, as such, the clock CLKn load can be more reduced than when applying a constant voltage to the light shielding layer LS. As a result, output characteristics of the pull-up TFT Tu may be improved.

Meanwhile, a connection TFT Tcn illustrated in FIG. 12 responds to a pulse type control signal V1 periodically supplied or non-periodically supplied to every frame to periodically apply a voltage V2 to a light shielding layer LS of a pull-up TFT Tu and, as such, the voltage of the light shielding layer LS may be reset periodically.

A start pulse or reset pulse having a frame cycle, or an additional pulse supplied during a vertical blank period may be applied as the control signal V1. At least one of a plurality of low voltages used at each stage may be applied as the voltage V2. In addition, a source of connection TFT Tcn is connected to an output node No and, as such, the low voltage output to the output node No through a pull-down TFT (Td, see FIG. 13) may be applied.

Accordingly, the light shielding layer LS of the pull-up TFT Tu is periodically reset by the connection TFT Tcn and, as such, may reduce or prevent voltage dissipation or fluctuation due to charge accumulation during a floating period. As a result, output characteristics of the pull-up TFT Tu may be improved.

Figure 13:
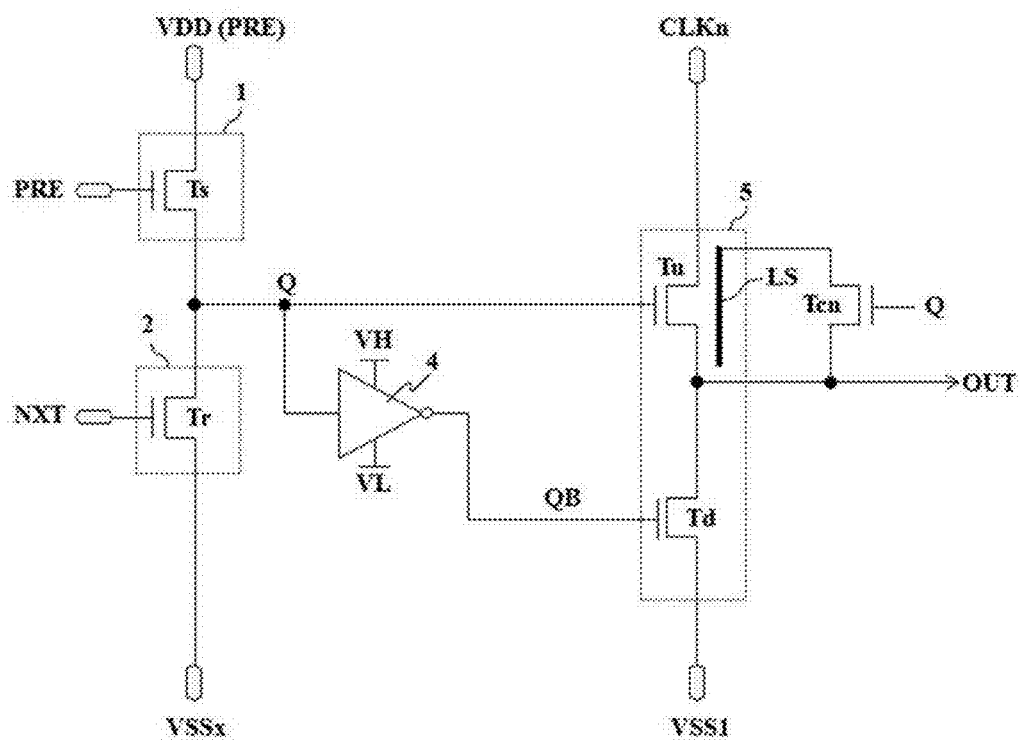
FIG. 13 is a circuit diagram illustrating a basic configuration of each stage in a shift register according to a fifth embodiment of the present invention.
Figure 14:
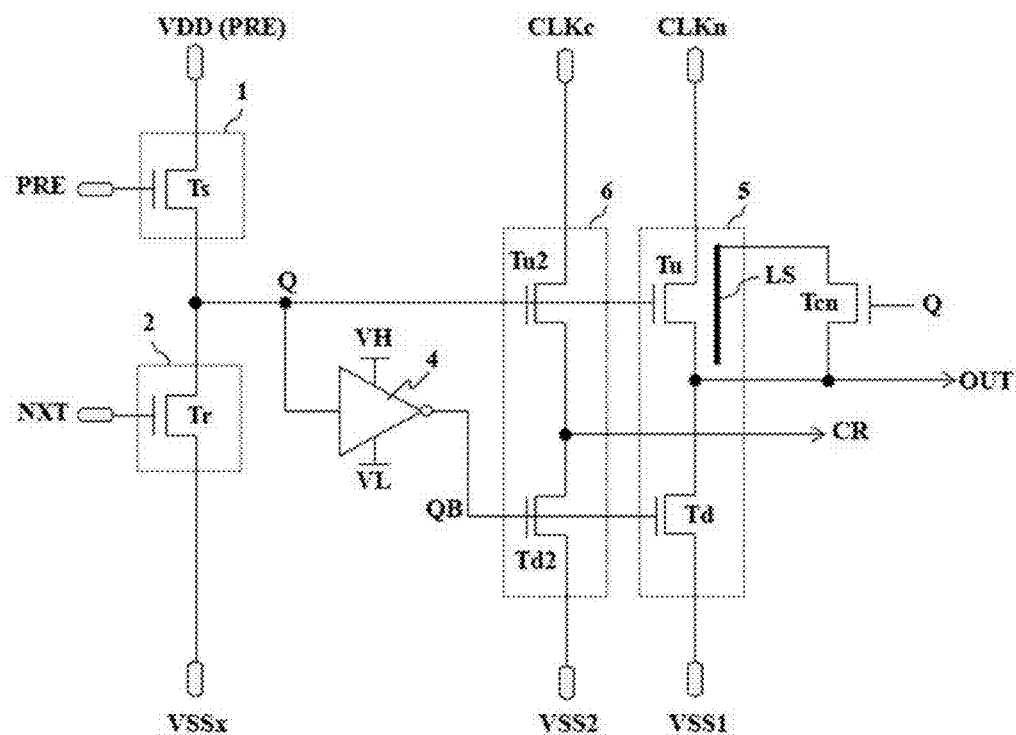
FIG. 14 is a circuit diagram illustrating a basic configuration of each stage in a shift register according to a sixth embodiment of the present invention.

FIGS. 13 and 14 are circuit diagrams each illustrating a basic configuration of each stage of shift registers according to fifth and sixth embodiments of the present invention.

The fifth embodiment illustrated in FIG. 13, as compared to the first embodiment illustrated in FIG. 9, further includes an inverter 4 and a pull-down TFT Td of the output part 5.

The sixth embodiment illustrated in FIG. 14, as compared to the fifth embodiment illustrated in FIG. 13, further includes a second pull-up TFT Tu2 of a second output part 6 and a second pull-down TFT Td2.

The inverter 4 responds to a control of the Q node to supply a high voltage VH or low voltage VL, which is opposite to the logic state of the Q node, to a QB node. Namely, when the Q node is in a high level state, the inverter 4 supplies the low voltage VL to the QB node, whereas, when the Q node is in a low level state, the inverter 4 supplies the high voltage VL to the QB node.

The pull-down TFT Td of the output part 5 responds to the high level of the QB node opposite to the Q node to output the low voltage VSS1 as the output voltage OUT.

The second pull-up TFT Tu2 of the second output part 6 responds to the Q node to output a carry clock CLKc as a carry output CR when the Q node is the high level. The second pull-down TFT Td2 of the second output part 6 responds to the high level of the QB node to output a low voltage VSS2 as the carry output CR.

A low voltage VSS1 supplied to the output part 5, the low voltage VSS2 supplied to the second output part 6, a low voltage VSSx supplied to the reset part 2, and a low voltage VL supplied to the inverter 4 are identical to or different from one another.

The connection TFT Tcn responds to the high level of the Q node to be turned on in company with the pull-up TFT Tu and, as such the scan output OUT is applied to the light shielding layer LS of the pull-up TFT Tu during an output period when the pull-up TFT Tu outputs the clock CLKn as the scan output OUT. During the period except the output period, the connection TFT Tcn responds to the low level of the Q node to be turned off in company with the pull-up TFT Tu, and as such, the light shielding layer LS floats.

Meanwhile, the inverter 4 and the output part 5 illustrated in FIG. 13 or the inverter 4 and the output parts 5 and 6 illustrated in FIG. 14 may be applied to the first embodiment illustrated in FIG. 9 rather than the second to fourth embodiments illustrated in FIGS. 10 to 12, respectively.

Figure 15:
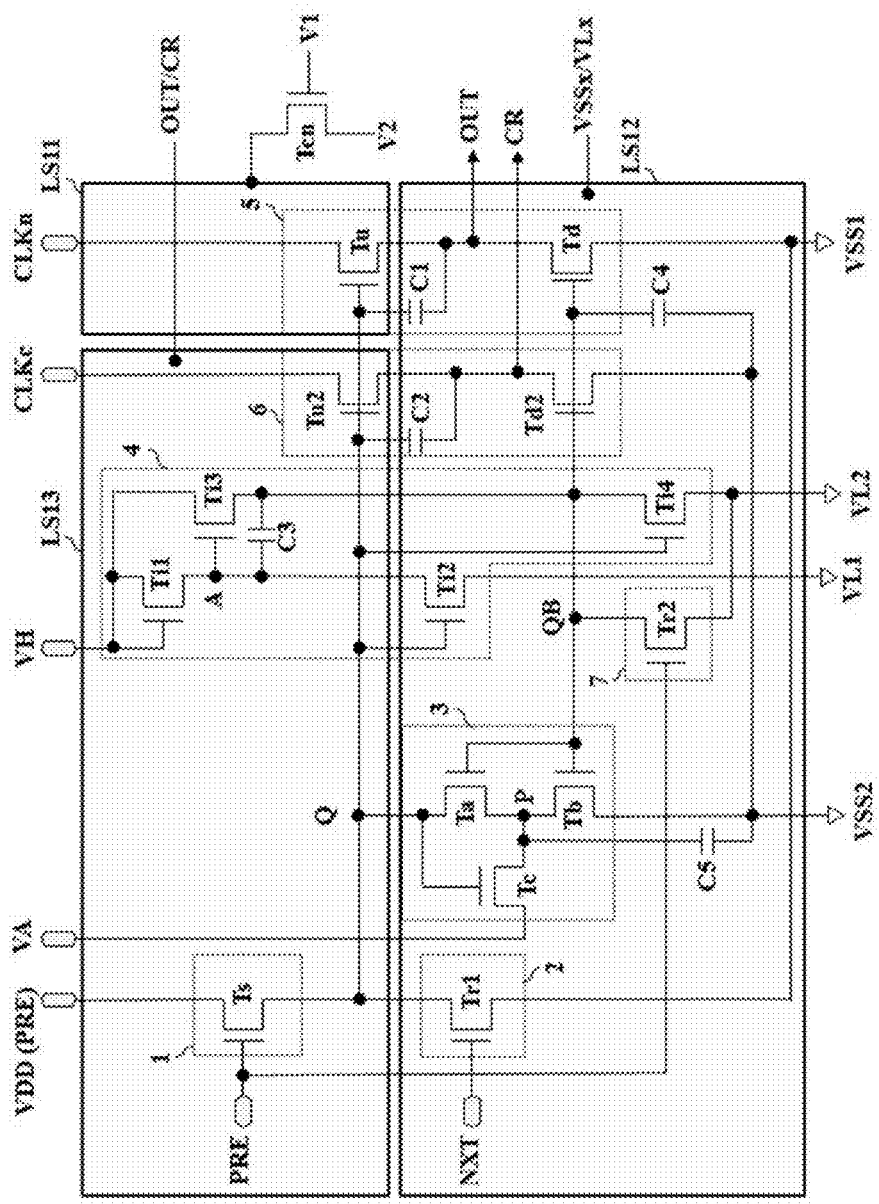
FIG. 15 is a circuit diagram illustrating a basic configuration of each stage in a shift register according to a seventh embodiment of the present invention.

FIG. 15 is a circuit diagram illustrating a basic configuration of each stage of a shift register according to a seventh embodiment of the present invention.

Referring to FIG. 15, each stage include a TFT part including a set part 1, a reset part 2, a noise cleaner 3, an inverter 4, an output part 5, and a second output part 6, first to third light shielding layers LS11, LS12, LS 13 overlapped with a TFT part divided into three parts applying different voltages in accordance with TFT functions, and a connection TFT Tcn selectively allowing the first shielding layer LS11 overlapped with the pull-up TFT Tu to float.

The set part 1, reset part 2, and noise cleaner 3 are included in a first node control part in order to control charge or discharge of the Q node, and the inverter 4 and second reset part 7 are included in a second node control part to control charge or discharge of the QB node.

A set TFT Ts of the set part 1 responds to a previous output PRE or a start pulse to supply a high voltage VDD or the previous output PRE to the Q node and, as such, the Q node is set to the high level. One of a carry output and a scan output of a previous stage as the previous output PRE may be supplied to agate of the set TFT Ts. One of a carry output and a scan output of the previous stage as a high voltage VDD or the previous output PRE A may be supplied to a drain of the set TFT Ts. In this case, the previous output PRE at the gate of the set TFT Ts and the previous output PRE supplied to the drain may be identical to or different from each other.

The reset TFT Tr of the reset part 2 responds to a next output NXT or a reset pulse to supply a low voltage VSS1 to the Q node and, as such, the Q node is reset to the low level. The carry output of the next stage is supplied as the next output NXT.

The inverter 4 outputs a high voltage or low voltage for the inverter 4 having a logic state contrary to that of the node Q to the node QB by response of the logic state of the node Q. For example, the inverter 4 includes first to fourth TFTs Ti1 to Ti4, that is, charge TFTs Ti1 and Ti3 of the QB node and discharge TFTs Ti2 and Ti4 of the QB node.

The first TFT Ti1 having a diode structure supplies a high voltage VH to an A node. The second TFT Ti2 responds to control of the Q node to supply the low voltage VL1 to the A node. The third TFT Ti3 responds to control of the A node to supply the high voltage VH to the QB node. The fourth TFT Ti4 responds to control of the Q node to supply a low voltage VL2 to the QB node.

When the Q node is at a low level, the second and fourth TFTs Ti2 and Ti4 are turned off, the A node is set to the high voltage VH through the turned-on first TFT Ti1, and the third TFT Ti3 is turned on by the high level of the A node to set the QB node to the high voltage VH.

When the Q node is at the high level, the second and fourth TFTs Ti2 and Ti4 are turned on. Although the second TFT Ti2 is turned on, the A node is reset to a low voltage VL1 through the second TFT Ti2 and, as such the third TFT Ti3 is turned off. Accordingly, the QB node is reset through the fourth TFT Ti4 turned on to the low voltage VL2.

The noise cleaner 3 includes a transistor-transistor offset (hereinafter, referred to as TTO) structure including three TFTs Ta, Tb and Tc.

The noise cleaner 3 resets the node Q to the low voltage VSS2 by response of the logic state of the node QB. For example, the noise cleaner 3 includes first and second TFTs Ta and Tb connected between the Q node and a supply line of the low voltage VSS2 in series while responding to the logic state of the QB node to reset the Q node to the low voltage VSS2, and a third TFT Tc responding to the logic state of the Q node to supply an offset voltage VA of a high voltage to a connection node P of the first and second TFTs Ta and Tb.

The first and second TFTs Ta and Tb of the noise cleaner 3 are turned off when the QB node is the low level. When the QB node is the high level, the first and second TFTs Ta and Tb are turned on to reset the Q node to the low voltage VSS1.

When the first and second TFTs Ta and Tb of the noise cleaner 3 are turned off due to the low level of the QB node, the third TFT Tc is turned on due to the high level of the Q node. The turned-on third TFT Tc applies the offset voltage VA of the high voltage to the connection node P of the first and second TFTs Ta and Tb, that is, a drain of the second TFT Tb and a source of the first TFT Ta. Accordingly, the low voltage VL2 of the QB node is applied to a gate of the first TFT Ta and the high voltage VA is applied to a source of the first TFT Ta and, as such, the voltage between the gate and source has a negative value which is lower than a threshold voltage. As a result, the first TFT Ta is completely turned off, and a leakage current of the Q node through the first and second TFTs Ta and Tb may be reduced or prevented.

The high voltage VDD or VH or the other DC voltages (>VL2) is applied as the offset voltage VA supplied to the drain of the third TFT Tc.

The second reset part 7 includes a second reset TFT Tr2 for resetting the QB node to the low voltage VL2 in accordance with response to the previous output PRE. The second reset TFT Tr2 is turned on in company with the set TFT Ts of the set part 1 to reset the QB node to the low level when the set TFT Ts sets the Q node to the high level.

The output part 5 includes the pull-up TFT Tu and pull-down TFT Td as illustrated above. The second output part 6 includes the second pull-up TFT Tu2 and second pull-down TFT Td2 as illustrated above.

When the Q node is the high level through the set part 1, the pull-up TFT Tu outputs the corresponding clock CLKn as a scan output OUT, and the second pull-up TFT Tu2 outputs the corresponding carry clock CLKc as a carry signal CR. The corresponding clock CLKn and carry clock CLKc are identical to or different from each other.

When the Q node is at the low level through the reset part 2 and noise cleaner 3, the pull-down TFT Td outputs the low voltage VSS1 as the low level of the scan output OUT, and the second pull-down TFT Td2 outputs the low voltage VSS2 as the low level of the carry signal CR.

The first light shielding layer LS11 is overlapped with the pull-up TFT Tu of the output part 5. The connection TFT Tcn connected to the first light shielding layer LS11 responds to the control signal V1 to apply the voltage V2 to the first light shielding layer LS11 during a particular period, and, as such, the first light shielding layer LS 11 selectively floats.

The Q node voltage is used as the control signal V1. One of a scan output OUT, a corresponding clock CLKn, a carry output CR, an AC voltage having two or more phases and a DC voltage may be used as the voltage V2.

Alternatively, a start pulse and a reset pulse applied to every frame, and a control pulse of a vertical blank period may be used as the control signal. One of various low voltages VSS1, VSS2, VL1, and VL2 for resetting the first light shielding layer LS11 may be used as the voltage V2.

To this end, the gate of the connection TFT Tcn may be connected to the Q node or a supply terminal of the control signal V1. The drain of the connection TFT Tcn may be connected to the first light shielding layer LS11. The source of the connection TFT Tcn may be connected to one of a clock node supplying the clock CLKn to the pull-up TFT Tu and a carry output node for outputting the carry output CR, or may be connected to any one of supply lines of a power-voltage supply.

The third light shielding layer LS13 is overlapped with the set part 1, the first and third TFTs Ti1 and Ti3 of the inverter 4, and charge TFTs Ts and Tu2 including the second pull-up TFT Tu2 of the second output part 6. The scan output OUT of the current stage or the carry output CR may be supplied to the third light shielding layer LS13. To this end, the third light shielding layer LS13 may be connected to the output node or carry output node.

Meanwhile, the connection TFT Tcn is electrically connected to the third light shielding layer LS13 rather than the first light shielding layer LS11 and, as such, may selectively apply the voltage V2 to the third light shielding layer LS13. In this case, the first and third light shielding layer LS11 and LS 13 may be electrically connected to each other.

The second light shielding layer LS12 is overlapped with the reset part 2, the second reset part 7, the noise cleaner 3, the second and fourth TFTs Ti2 and Ti4 of the inverter 4, the pull-down TFT Td of the output part 5, and discharge TFTs Tr1, Tr2, Ta, Tb, Tc, and Td2 including the second pull-down TFT Td2 of the second output part 6. The second light shielding layer LS12 may be connected to one of supply lines for the low voltage and, as such one of the low voltages VSS1, VSS2, VL1, and VL2 may be applied.

Meanwhile, the third TFT Tc applying the offset voltage VA of the high voltage to the noise cleaner 3 may be overlapped with the third light shielding layer LS 13.

The connection TFT Tcn may be overlapped with any one of the first to third light shielding layers LS11, LS12 and LS13.

The first and third TFTs Ti1 and Ti3 connected to the high voltage VH at the inverter 4 may be overlapped with the second light shielding layer LS12, the second and fourth TFTs Ti2 and Ti4 may be overlapped with the third light shielding layer LS13, or the entire inverter 4 may be overlapped with any one of the second and third light shielding layers LS12 and LS13. The high voltages VDD, VA, and VH supplied from the power supply may be identical to or different from one another, and may be referred to as a gate on voltage.

The low voltages VSS1, VSS2, VL1, and VL2 supplied from the power supply may be identical to or different from one another and may be referred to as a gate off voltage.

For example, VSS1 may be equal to or greater than VSS2. VSS2 may be identical to or different from VL2 of the inverter 4. VL2 may be equal to or greater than VL1 at the inverter 4.

If VSS2<VSS1, the reset TFT Tr1 of the reset part 2 responds to the low voltage VSS2, that is, the low level, of the next carry signal, that is, the next output NXT, and then is turned off. In this case, the voltage (Vgs=VSS2−VSS1) between the gate and source has a negative value lower than the threshold voltage and, as such, the reset TFT Tr1 is completely turned off. As a result, although the threshold voltage is shifted in the negative direction due to deterioration, a leakage current of the Q node may be reduced or prevented.

If VL2<VSS2<VSS1, the pull-down TFTs Td and Td2 controlled by the QB node are completely turned off and, as such, a leakage current of an output terminal may be reduced or prevented.

In addition, each stage illustrated in FIG. 15 includes capacitors C1, C2, C3 each connected between the corresponding gate and source of the first pull-up TFT Tu, between the corresponding gate and source of the second pull-up TFT Tu2, and between the corresponding gate and source of the third TFT Ti3 of the inverter of the inverter 4 and, as such, amplifies each corresponding gate voltage in accordance with the high level applied to each drain. Capacitors C4 and C5 are further provided between the QB node and a low voltage VSS2 line and between the connection node P of the noise cleaner 3 and the low voltage VSS2 line, respectively, and, as such, a voltage of the connection node P may be stably maintained. One of the above capacitors C1 to C5 may be applied to each embodiment of the present invention.

Figure 16:
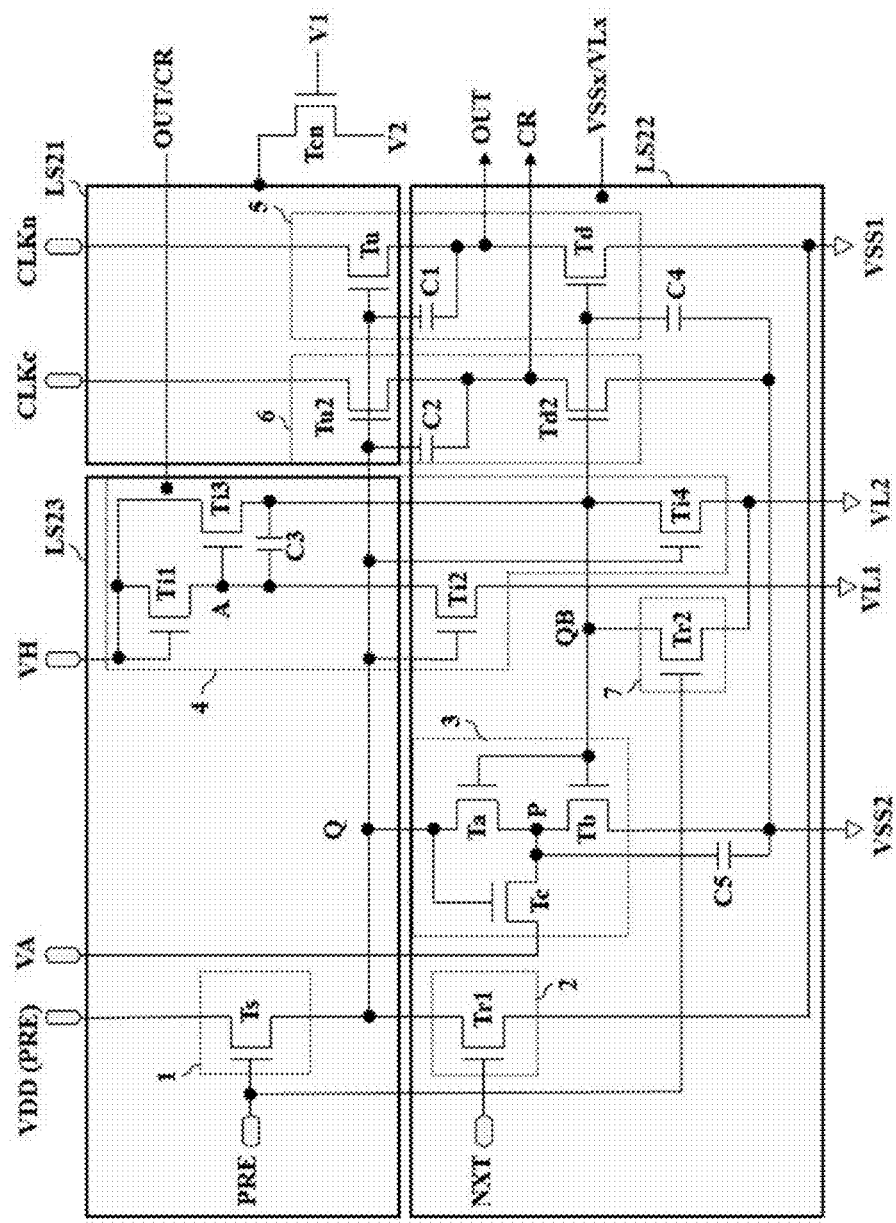
FIG. 16 is a circuit diagram illustrating a basic configuration of each stage in a shift register according to an eighth embodiment of the present invention.

FIG. 16 is a circuit diagram illustrating a basic configuration of each stage in a shift register according to an eighth embodiment of the present invention.

As compared to the seventh embodiment illustrated in FIG. 15, in each stage of the eighth embodiment illustrated in FIG. 16, there is a difference in that the second pull-up TFT Tu2 is overlapped with the first light shielding layer LS21. However, the other components are the same as the components of the above-described embodiments.

The first light shielding layer LS21 is overlapped with the pull-up TFT Tu of the output part 5 and the second pull-up TFT Tu2 of the output part 6. The connection TFT Tcn responds to the first signal V1 to apply the voltage V2 to the first light shielding layer LS21 during a particular period and, as such, the first light shielding layer LS21 selectively floats.

The third light shielding layer LS23 is overlapped with the set part 1, and the charge TFTs Ts, Ti1, and Ti3 including the first and third TFTs Ti1 and Ti3 of the inverter 4. The scan output OUT or carry output CR is applied to the third light shielding layer LS23.

The second light shielding layer LS22 is identical to the second light shielding layer LS12 illustrated in FIG. 15.

The connection TFT Tcn may be overlapped with one of the first to third light shielding layers LS21, LS22, and LS 23.

The first and third TFTs Ti1 and Ti3 connected to the high voltage VH in the inverter 4 may be overlapped with the second light shielding layer LS22, the second and fourth TFTs Ti2 and Ti4 connected to the low voltages VL1 and VL2 may be overlapped with the third light shielding layer LS23, or an entire inverter 4 may be overlapped with one of the second and third light shielding layers LS22 and LS23.

According to the present invention including three light shielding layers, the first light shielding layer may be overlapped with the pull-up transistor TFT Tu; the second light shielding layer may be overlapped with the reset part 2, the pull-down transistor TFT Td, the second pull-down transistor TFT Td2, and the first and second TFT Ta and Tb of the noise cleaner 3; the third light shielding layer may be overlapped with the set part 1; the second pull-up transistor TFT Tu2 may be overlapped with one of the first to third light shielding layers; the transistors connected to the high voltage for the inverter 4 in the inverter 4 may be overlapped with one of the second and third light shielding layers, and the transistor connected to the low voltage for the inverter 4 in the inverter 4 may be overlapped with one of the second and third light shielding layers; the third TFT Tc of the noise cleaner 3 may be overlapped with one of the second and third light shielding layers; and the connection TFT Tcn may be overlapped with one of the first to third light shielding layers.

Figure 17:
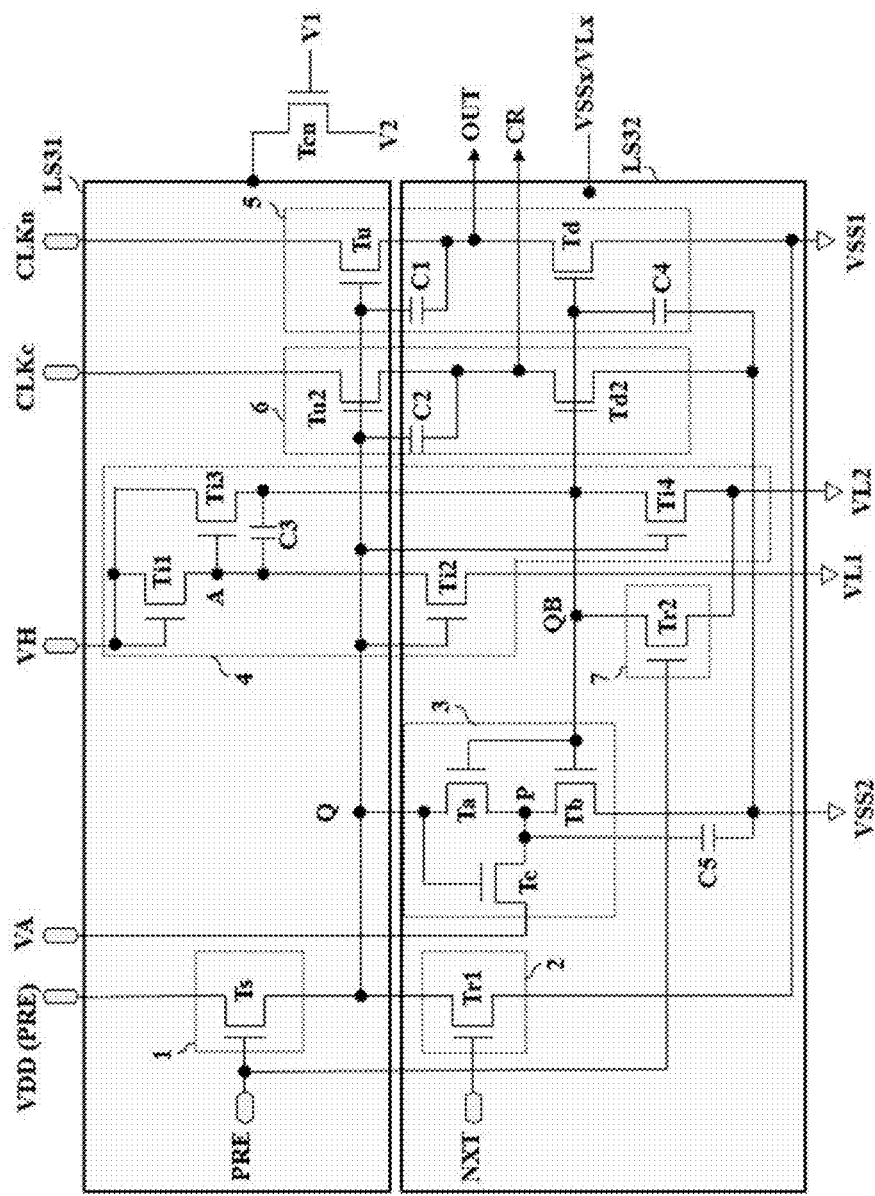
FIG. 17 is a circuit diagram illustrating a basic configuration of each stage in a shift register according to a ninth embodiment of the present invention.

FIG. 17 is a circuit diagram illustrating a basic configuration of each stage of a shift register according to a ninth embodiment of the present invention.

As compared to the seventh embodiment illustrated in FIG. 15, in each stage of the ninth embodiment illustrated in FIG. 17, there is a difference in that each stage includes first and second light shielding layers LS31 and LS32 overlapped with the TFT part by dividing the TFT part into two portions while applying different voltages. However, the other components are the same as the components of the above-described embodiments.

The first light shielding layer LS31 is overlapped with the pull-up TFT Tu of the output part 5, the second pull-up TFT Tu2 of the second output part 6, and the charge TFTs Ts, Ti1, and Ti3 including the first and third TFT Ti1 and Ti3 of the inverter 4. The connection TFT Tcn responds to the control signal V1 to apply the voltage V2 to the first light shielding layer LS31 during a particular period and, as such, the first light shielding layer LS31 selectively floats.

The second light shielding layer LS32 is the same as the second light shielding layer LS12 illustrated in FIG. 15.

The connection TFT Tcn may be overlapped with one of the first and second light shielding layers LS31 and LS32.

Figure 18:
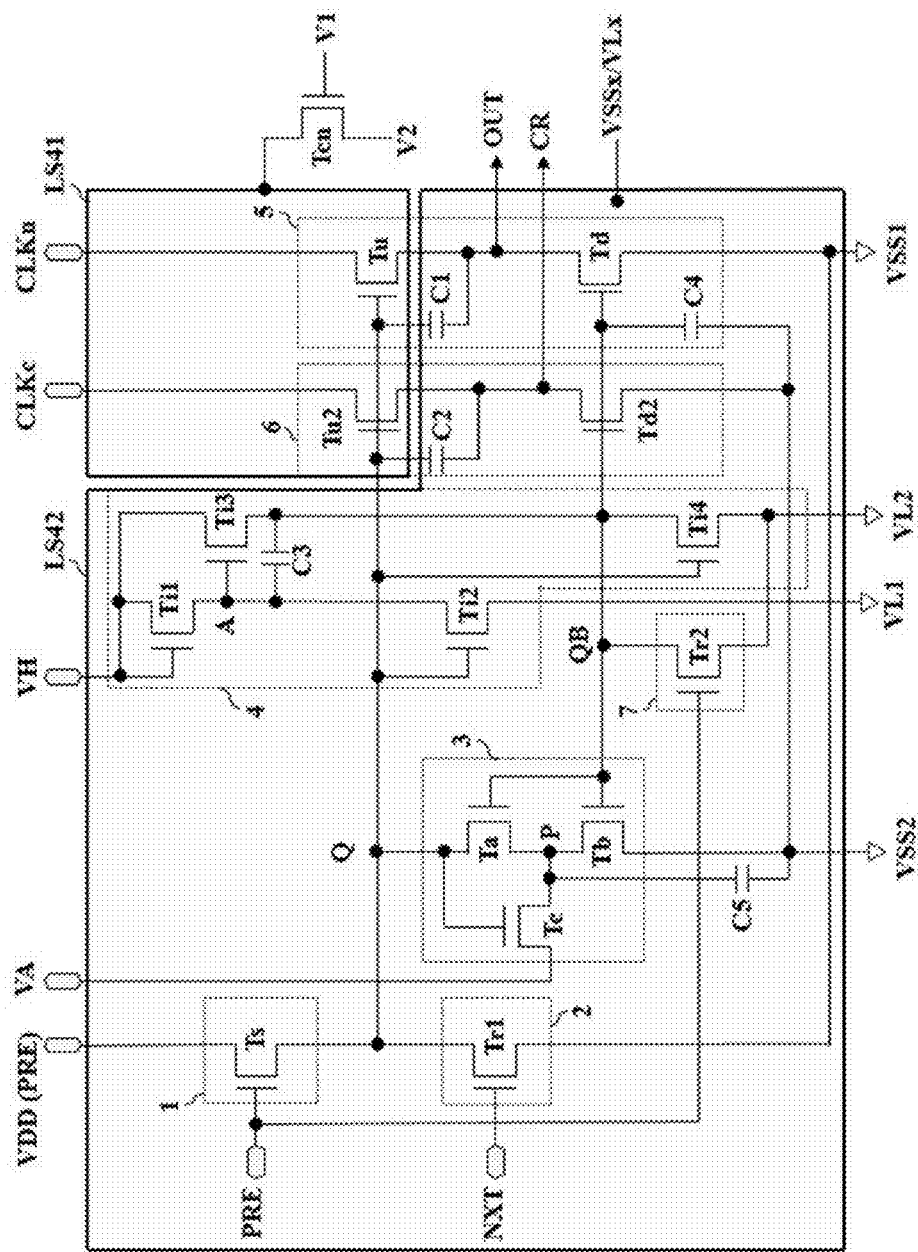
FIG. 18 is a circuit diagram illustrating a basic configuration of each stage in a shift register according to a tenth embodiment of the present invention.

FIG. 18 is a circuit diagram illustrating a basic configuration of each stage of a shift register according to a tenth embodiment of the present invention.

Each stage of the tenth embodiment illustrated in FIG. 18 includes first and second light shielding layers LS41 and LS42 overlapped with the TFT part by dividing the TFT part into two portions while applying different voltages. However, the other components are the same as the components of the above-described embodiments.

The first light shielding layer LS41 is the same as the first light shielding layer LS21 illustrated in FIG. 16.

The second light shielding layer LS42 may be overlapped with the set part 1, the reset parts 2 and 7, the noise cleaner 3, the inverter 4, the pull-down TFT Td of the output part 5, and the second pull-down TFT Td2 of the second output part 6, and one of low voltages VSS1, VSS2, VL1, and VL2 may be applied thereto.

The connection TFT Tcn may be overlapped with one of the first and second light shielding layers LS41 and LS42.

According to the present invention including two light shielding layers, the first light shielding layer may be overlapped with the pull-up transistor TFT Tu, the second pull-up transistor TFT Tu2, the set part 1 and transistor connected to the high voltage for the inverter 4, in the inverter 4, and may be overlapped or non-overlapped with the connection TFT Tcn, and the second light shielding layer may be overlapped with the transistors except for the transistor overlapped with the first light shielding layer in each stage. Or, the first light shielding layer may be overlapped with the pull-up transistor TFT Tu and the second pull-up transistor TFT Tu2, and may be overlapped or non-overlapped with the connection TFT Tcn, and the second light shielding layer may be overlapped with the pull-up transistor TFT Tu and the transistors except for the transistor overlapped with the first light shielding layer in each stage. Or, the first light shielding layer may be overlapped with the pull-up transistor TFT Tu, and may be overlapped or non-overlapped with the connection TFT Tcn, and the second light shielding layer may be overlapped with the transistors except for the pull-up transistor TFT Tu in each stage.

Figure 19:
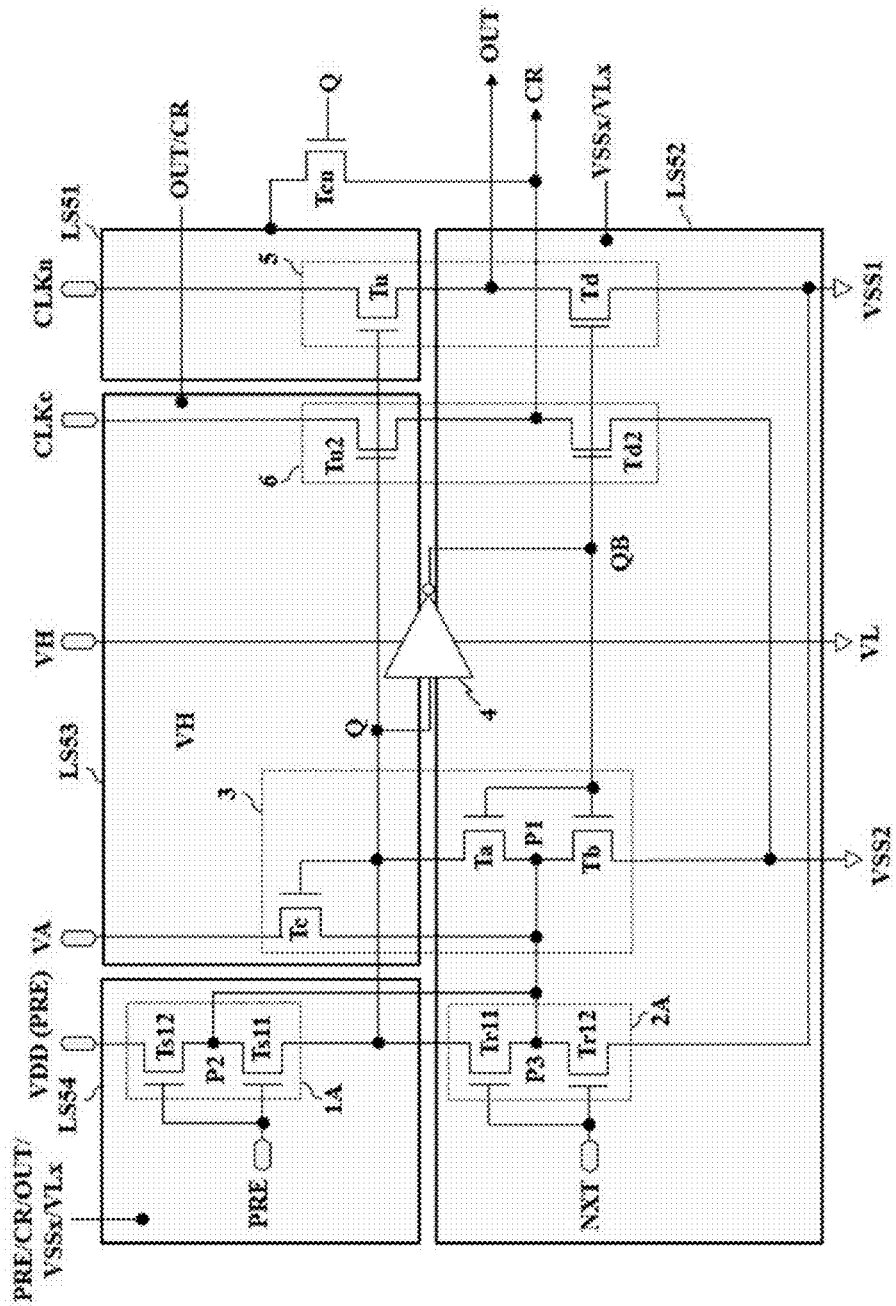
FIG. 19 is a circuit diagram illustrating a basic configuration of each stage in a shift register according to an eleventh embodiment of the present invention.
Figure 20:
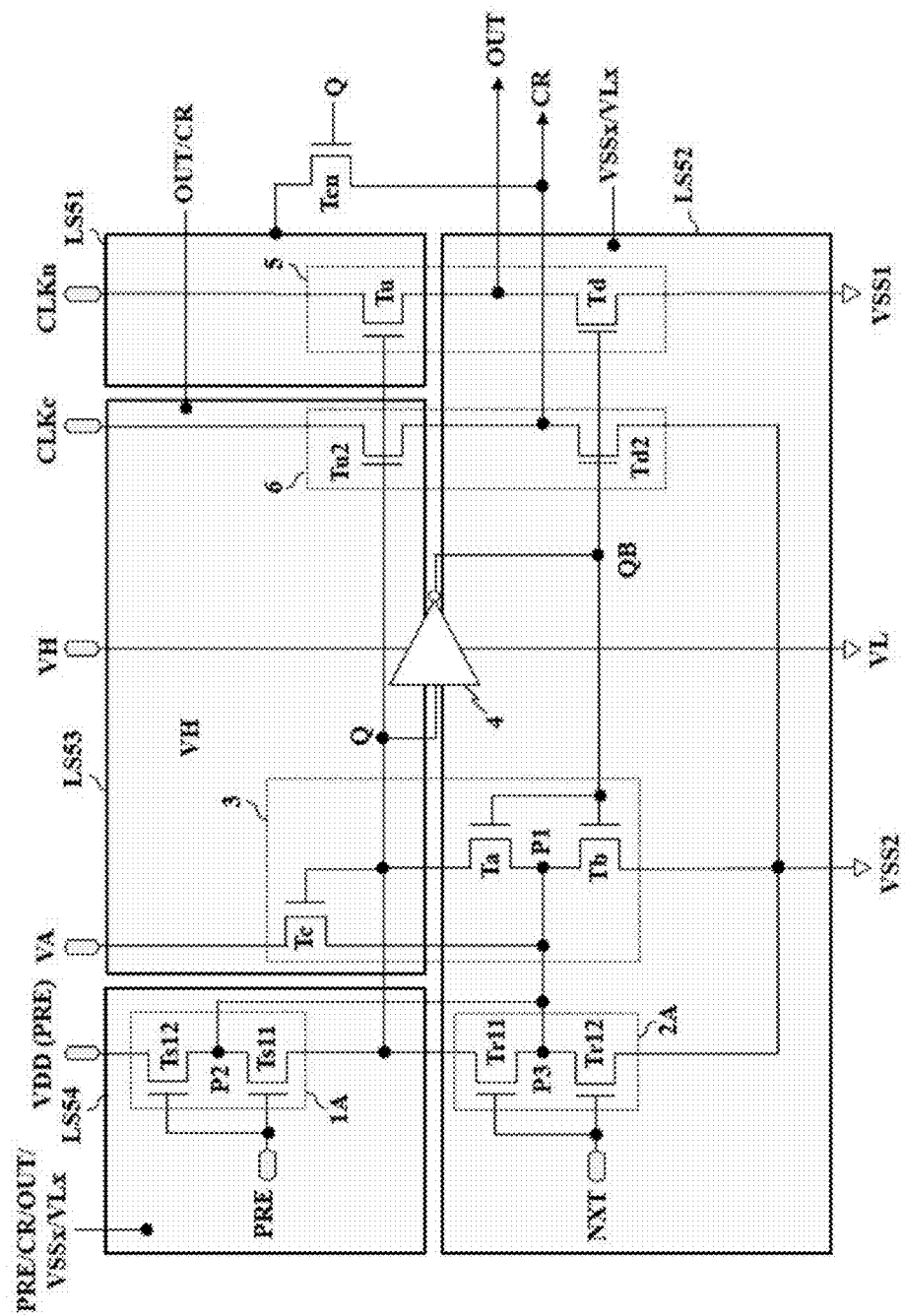
FIG. 20 is a circuit diagram illustrating a basic configuration of each stage in a shift register according to a twelfth embodiment of the present invention.

FIGS. 19 and 20 are circuit diagrams each illustrating a basic configuration of each stage in shift registers according to eleventh and twelfth embodiments of the present invention.

As compared to the above illustrated embodiments, there are differences in that each stage of the eleventh and twelfth embodiments illustrated in FIGS. 19 and 20 includes a first to fourth light shielding layer LS51, LS52, LS53, and LS54 overlapped with the TFT part by dividing the TFT part into four portions while applying different voltages, and the set part 1A and the reset part 2A share the third TFT Tc of the noise cleaner, and, as such the stage has a TTO structure.

Furthermore, the stage of the eleventh embodiment illustrated in FIG. 19, which is the same as the above-illustrated embodiments, supplies the low voltage VSS1 identical to the output part 5 to the reset part 2A. However, the stage of the twelfth embodiment illustrated in FIG. 20 supplies the low voltage VSS2 identical to the second output part 6 and noise cleaner 3, to the reset part 2A.

The other components are the same as the components of the above-described embodiments.

A set part 1A includes a pair of set TFTs Ts11 and Ts12 connected to each other in series. A reset part 2A includes a pair of reset TFTs Tr11 and Tr12 connected to each other in series. A connection node P2 between the set TFTs Ts11 and Ts12 and a connection node P3 between the reset TFTs Tr11 and Tr12 are electrically connected to a connection node P1 between first and second TFTs Ta and Tb of a noise cleaner 3. As a result, the set part 1A and reset part 2A share a third TFT Tc of the noise cleaner 3 for supplying an offset voltage.

Accordingly, when a high offset voltage VA is applied to each of the illustrated connection nodes P1, P2, and P3 by responding to the high level of a Q node, a voltage Vgs between a gate and a source of each of a first TFT Ta of the noise cleaner 3, a set TFT Ts11 of the set part 1A, and a reset TFT Tr11 of the reset part 2A are lower than a threshold voltage, thus being completely turned off. As a result, a leakage current of the Q node through the noise cleaner 3, set part 1A, and reset part 2A may be reduced or prevented.

A gate of the connection TFT Tcn is connected to the Q node. A source of the connection TFT Tcn is connected to a carry output node for generating a carry output CR. A drain of the connection TFT Tcn is connected to a first light shielding layer LS51 overlapped with the pull-up TFT Tu.

A third light shielding layer LS53 is overlapped with a second pull-up TFT Tu of a second output part 6 and charge TFTs in an inverter 4, and the scan output OUT or carry output CR of a current stage is applied thereto.

The second light shielding layer LS52 is overlapped with the reset part 2A, the first and second TFTs Ta and Tb of the noise cleaner 3, discharge TFTs of the inverter 4, the pull-down TFT Td of the output part 5, and the second pull-down TFT Td2 of the second output part 6, and one of low voltages VSS1, VSS2, VL1 and VL2 is applied thereto.

A fourth light shielding layer LS54 is overlapped with set TFTs Ts 11 and Ts12 of the set part 1A. One of the carry output CR or scan output OUT of the current stage, a previous carry or previous scan output included in the previous output PRE, or the low voltages VSS1, VSS2, VL1 and VL2 may be applied to the fourth light shielding layer LS54. When one of the carry output CR and scan output OUT of the current stage is supplied to the fourth light shielding layer LS54, the fourth light shielding layer LS54 may be electrically connected to the third light shielding layer LS53, as described above, through direct connection or indirect connection. When one of the low voltages VSS1, VSS2, VL1 and VL2 is supplied to the fourth light shielding layer LS54, the fourth light shielding layer LS54 may be electrically connected to the second light shielding layer LS52, as described above, through a direct connection or indirect connection.

The connection TFT Tcn may be overlapped with one of the first to fourth light shielding layers LS51, LS52, LS53, and LS54.

In the inverter 4, the first and third TFT Ti1 and Ti3 connected to the high voltage VH may be overlapped with the second light shielding layer LS52, the second and fourth TFT Ti2 and Ti4 connected to the low voltages VL1 and VL2 may be overlapped with the third light shielding layer LS53, or the entire inverter 4 may be overlapped with one of the second and third light shielding layers LS52 and LS53.

As is apparent from the above description, there may be various advantages according to the embodiments of the present invention.

First, light deterioration can be reduced or prevented by the light shield layer overlapped with the TFT part in each stage and, as such, operation range and output stability of the TFT may be improved.

Secondly, the light shielding layer overlapped with the output TFT in each stage selectively floats through the connection TFT, and, as such, the clock load can be reduced due to the light shielding layer and voltage dissipation can be reduced or prevented due to floating by periodically applying a voltage. As a result, output characteristics may be improved.

Third, the light shielding layer is divided into a plurality of regions according to TFT functions in each stage and different voltages are applied to the divided regions, and, as such, characteristics of the TFTs according to the regions may be controlled. Furthermore, the threshold voltage can be controlled by a field effect of the light shielding layer and, as such, output stability may be improved and normal operation range may expand.

It will be apparent to those skilled in the art that the present invention described above is not limited to the embodiments described above and the accompanying drawings, and various substitutions, modifications, and alterations may be devised within the spirit and scope of the present invention.

What is claimed is:

1. A shift register comprising a plurality of stages, wherein each stage comprises:
   an output part comprising a pull-up transistor responding to a logic state of a first node to output a corresponding clock of a plurality of clocks as a scan signal, and a pull-down transistor responding to a logic state of a second node to output a low voltage as the scan signal;
   a node control part comprising a plurality of transistors for controlling the logic state of the first node and the logic state of the second node;
   at least two light shielding layers individually overlapped with the transistors of the stage by dividing the transistors into at least two regions; and
   a connection transistor selectively applying a voltage to a first shielding layer overlapped with the pull-up transistor of the two light shielding layers to allow the first light shielding layer to float.

2. The shift register according to claim 1, wherein:
   the connection transistor comprises a gate applying a control signal, a first electrode applying the voltage, and a second electrode electrically connected to the first light shielding layer; and
   as the control signal, the voltage of the first node is applied, and one of the scan signal, the corresponding clock, a carry signal, and an external AC voltage is applied to the first electrode, or
   as the control signal, a pulse signal is applied periodically or non-periodically as a frame unit, and one of low voltages including a first low voltage applied to the stage is applied to the first electrode; and
   when the carry signal is applied to the first electrode, the stage further comprises a second pull-up transistor outputting a carry clock identical to or different from the corresponding clock as the carry signal by response of the logic state of the first node, and a second output part outputting a second low voltage of the low voltages as the carry signal by response of the logic state of the second node.

3. The shift register according to claim 2, wherein the at least two light shielding layers comprise:

the first light shielding layer and a second light shielding layer applying one of low voltages, or the first light shielding layer, the second light shielding layer, and a third light shielding layer applying one of the scan signal and carry signal.

4. The shift register according to claim 3, wherein the node control part comprises:
a set part setting the first node as a voltage for the set part by response of the logic state of a first control terminal;
a reset part resetting the first node to one of the first and second low voltages by response of the logic state of a second control terminal;
a noise cleaner resetting the first node to the second low voltage by response of the logic state of the second node; and
an inverter outputting a high voltage or low voltage for the inverter having a logic state contrary to that of the first node to the second node by response of the logic state of the first node, and wherein,
the first control terminal is supplied with a start pulse, or a previous scan signal or previous carry signal output from one of previous stages;
the voltage for the set part is supplied with a high voltage, the previous scan signal or the previous carry signal; and
the second control terminal is supplied with a reset pulse, or a next scan signal or next carry signal output from one of next stages.

5. The shift register according to claim 4, wherein the noise cleaner comprises:
a first and second transistors connected between the first node and a supply line of the second low voltage connected to each other in series to reset the first node to the second low voltage in accordance with the logic state of the second node; and
a third transistor supplying an offset voltage of a high level to a connection node between the first and second transistors in accordance with the logic state of the first node.

6. The shift register according to claim 5, wherein when the at least two light shielding layers comprise the first and second light shielding layers,
the first light shielding layer is overlapped with the pull-up transistor, the second pull-up transistor, the set part and transistor connected to the high voltage for the inverter, in the inverter, and is overlapped or non-overlapped with the connection transistor, and the second light shielding layer is overlapped with the transistors except for the transistor overlapped with the first light shielding layer in each stage, or
the first light shielding layer is overlapped with the pull-up transistor and the second pull-up transistor, and is overlapped or non-overlapped with the connection transistor, and the second light shielding layer is overlapped with the transistors except for the transistor overlapped with the first light shielding layer in each stage, or
the first light shielding layer is overlapped with the pull-up transistor, and is overlapped or non-overlapped with the connection transistor, and the second light shielding layer is overlapped with the transistors except for the pull-up transistor.

7. The shift register according to claim 5, wherein when the at least two light shielding layers comprise the first to third light shielding layers, the first light shielding layer is overlapped with the pull-up transistor;
the second light shielding layer is overlapped with the reset part, the pull-down transistor, the second pull-down transistor, and the first and second transistor of the noise cleaner;
the third light shielding layer is overlapped with the set part;
the second pull-up transistor is overlapped with one of the first to third light shielding layers;
the transistors connected to the high voltage for the inverter in the inverter are overlapped with one of the second and third light shielding layers, and the transistor connected to the low voltage for the inverter in the inverter is overlapped with one of the second and third light shielding layers;
the third transistor of the noise cleaner is overlapped with one of the second and third light shielding layers; and
the connection transistor is overlapped with one of the first to third light shielding layers.

8. The shift register according to claim 5, wherein the at least two light shielding layer comprises:
the first to third light shielding layers; and
a fourth light shielding layer overlapped with the set part and to which one of the scan signal, the carry signal and previous scan signal, the previous carry signal, and the low voltages is applied; and wherein,
the first light shielding layer is overlapped with the pull-up transistor;
the second light shielding layer is overlapped with the reset part, the pull-down transistor, the second pull-down transistor, and the first and second transistors of the noise cleaner;
the second pull-up transistor is overlapped with one of the first to third light shielding layers;
the transistors connected to the high voltage for the inverter is overlapped with one of the second and third light shielding layers, and the transistor connected to the low voltage for the inverter is overlapped with one of the second and third light shielding layers;
the third transistor of the noise cleaner is overlapped with one of the second and third light shielding layers;
the connection transistor is overlapped with one of the first to fourth light shielding layers; and
the fourth light shielding layer to which the scan signal or carry signal is applied, is electrically connected to the third light shielding layer through direct connection or indirect connection; or
the fourth light shielding layer to which one of the low voltages is applied, is electrically connected to the second light shielding layer through direct connection or indirect connection.

9. The shift register according to claim 8, wherein:
the set part comprises first and second set transistors connected between the first node and the supply line of the voltage for the set part in series, and is controlled by the first control terminal;
the reset part comprises a first and second reset transistor connected between the first node and one of supply lines for the first low voltage and second low voltage in series, and is controlled by the second control terminal; and
a connection node between the first and second set transistors and a connection node between the first and second reset transistors are electrically connected to a connection node between the first and second transistors of the noise cleaner.

10. A display device comprising:
a gate driver embedded in a non-display area of a display panel and including a shift register comprising a plurality of stages individually driving gate lines of the display panel,
wherein each stage comprises:
an output part comprising a pull-up transistor responding to a logic state of a first node to output a corresponding clock of a plurality of clocks as a scan signal, and a pull-down transistor responding to a logic state of a second node to output a low voltage as the scan signal;
a node control part comprising a plurality of transistors for controlling the logic state of the first node and the logic state of the second node;
at least two light shielding layers individually overlapped with the transistors of the stage by dividing the transistors into at least two regions; and
a connection transistor selectively applying a voltage to a first shielding layer overlapped with the pull-up transistor of the two light shielding layers to allow the first light shielding layer to float,
wherein the shift register includes an oxide transistor.

11. The display device according to claim 10, wherein:
the connection transistor comprises a gate applying a control signal, a first electrode applying the voltage, and a second electrode electrically connected to the first light shielding layer; and
as the control signal, the voltage of the first node is applied, and one of the scan signal, the corresponding clock, a carry signal, and an external AC voltage is applied to the first electrode, or
as the control signal, a pulse signal is applied periodically or non-periodically as a frame unit, and one of low voltages including a first low voltage applied to the stage is applied to the first electrode; and
when the carry signal is applied to the first electrode, the stage further comprises a second pull-up transistor outputting a carry clock identical to or different from the corresponding clock as the carry signal by response of the logic state of the first node, and a second output part outputting a second low voltage of the low voltages as the carry signal by response of the logic state of the second node.

12. The display device according to claim 11, wherein the at least two light shielding layers comprise:
the first light shielding layer and a second light shielding layer applying one of low voltages, or
the first light shielding layer, the second light shielding layer, and a third light shielding layer applying one of the scan signal and carry signal.

13. The display device according to claim 12, wherein the node control part comprises:
a set part setting the first node as a voltage for the set part by response of the logic state of a first control terminal;
a reset part resetting the first node to one of the first and second low voltages by response of the logic state of a second control terminal;
a noise cleaner resetting the first node to the second low voltage by response of the logic state of the second node; and
an inverter outputting a high voltage or low voltage for the inverter having a logic state contrary to that of the first node to the second node by response of the logic state of the first node, and
wherein,
the first control terminal is supplied with a start pulse, or a previous scan signal or previous carry signal output from one of previous stages;
the voltage for the set part is supplied with a high voltage, the previous scan signal or the previous carry signal; and
the second control terminal is supplied with a reset pulse, or a next scan signal or next carry signal output from one of next stages.

14. The display device according to claim 13, wherein the noise cleaner comprises:
a first and second transistors connected between the first node and a supply line of the second low voltage connected to each other in series to reset the first node to the second low voltage in accordance with the logic state of the second node; and
a third transistor supplying an offset voltage of a high level to a connection node between the first and second transistors in accordance with the logic state of the first node.

15. The display device according to claim 14, wherein when the at least two light shielding layers comprise the first and second light shielding layers,
the first light shielding layer is overlapped with the pull-up transistor, the second pull-up transistor, the set part and transistor connected to the high voltage for the inverter, in the inverter, and is overlapped or non-overlapped with the connection transistor, and the second light shielding layer is overlapped with the transistors except for the transistor overlapped with the first light shielding layer in each stage, or
the first light shielding layer is overlapped with the pull-up transistor and the second pull-up transistor, and is overlapped or non-overlapped with the connection transistor, and the second light shielding layer is overlapped with the pull-up transistor and the transistors except for the transistor overlapped with the first light shielding layer in each stage, or
the first light shielding layer is overlapped with the pull-up transistor, and is overlapped or non-overlapped with the connection transistor, and the second light shielding layer is overlapped with the transistors except for the pull-up transistor.

16. The display device according to claim 14, wherein when the at least two light shielding layers comprise the first to third light shielding layers,
the first light shielding layer is overlapped with the pull-up transistor;
the second light shielding layer is overlapped with the reset part, the pull-down transistor, the second pull-down transistor, and the first and second transistor of the noise cleaner;
the third light shielding layer is overlapped with the set part;
the second pull-up transistor is overlapped with one of the first to third light shielding layers;
the transistors connected to the high voltage for the inverter in the inverter are overlapped with one of the second and third light shielding layers, and the transistor connected to the low voltage for the inverter in the inverter is overlapped with one of the second and third light shielding layers;
the third transistor of the noise cleaner is overlapped with one of the second and third light shielding layers; and
the connection transistor is overlapped with one of the first to third light shielding layers.

17. The display device according to claim 14, wherein the at least two light shielding layer comprises:
the first to third light shielding layers; and
a fourth light shielding layer overlapped with the set part and to which one of the scan signal, the carry signal and previous scan signal, the previous carry signal, and the low voltages is applied; and wherein,
the first light shielding layer is overlapped with the pull-up transistor;
the second light shielding layer is overlapped with the reset part, the pull-down transistor, the second pull-down transistor, and the first and second transistors of the noise cleaner;
the second pull-up transistor is overlapped with one of the first to third light shielding layers;
the transistors connected to the high voltage for the inverter is overlapped with one of the second and third light shielding layers, and the transistor connected to the low voltage for the inverter is overlapped with one of the second and third light shielding layers;
the third transistor of the noise cleaner is overlapped with one of the second and third light shielding layers;
the connection transistor is overlapped with one of the first to fourth light shielding layers; and
the fourth light shielding layer to which the scan signal or carry signal is applied, is electrically connected to the third light shielding layer through direct connection or indirect connection; or
the fourth light shielding layer to which one of the low voltages is applied, is electrically connected to the second light shielding layer through direct connection or indirect connection.

18. The display device according to claim 17, wherein:
the set part comprises first and second set transistors connected between the first node and the supply line of the voltage for the set part in series, and is controlled by the first control terminal;
the reset part comprises a first and second reset transistor connected between the first node and one of supply lines for the first low voltage and second low voltage in series, and is controlled by the second control terminal; and
a connection node between the first and second set transistors and a connection node between the first and second reset transistors are electrically connected to a connection node between the first and second transistors of the noise cleaner.

* * * * *